United States Patent
Sharma et al.

(10) Patent No.: US 10,062,946 B2
(45) Date of Patent: Aug. 28, 2018

(54) REFLECTION-BASED RF PHASE SHIFTER

(71) Applicant: pSemi Corporation, San Diego, CA (US)

(72) Inventors: Vikas Sharma, Elgin, IL (US); Peter Bacon, Derry, NH (US); Mark Moffat, Mortimer (GB)

(73) Assignee: pSemi Corporation, San Diego, CA (US)

( * ) Notice: Subject to any disclaimer, the term of this patent is extended or adjusted under 35 U.S.C. 154(b) by 217 days.

(21) Appl. No.: 14/988,463

(22) Filed: Jan. 5, 2016

(65) Prior Publication Data

US 2017/0194688 A1 Jul. 6, 2017

(51) Int. Cl.
*H01P 9/00* (2006.01)
*H01P 5/16* (2006.01)
*H01P 1/18* (2006.01)

(52) U.S. Cl.
CPC . *H01P 5/16* (2013.01); *H01P 1/18* (2013.01)

(58) Field of Classification Search
CPC .... H01P 5/18; H01P 1/18; H01P 1/185; H01P 1/127
See application file for complete search history.

(56) References Cited

U.S. PATENT DOCUMENTS

| | | | |
|---|---|---|---|
| 3,516,024 A | 6/1970 | Lange | |
| 3,611,199 A * | 10/1971 | Safran | H01P 1/185 333/109 |
| 4,586,047 A | 4/1986 | Inacker et al. | |
| 4,859,972 A * | 8/1989 | Franke | H01P 1/185 333/161 |
| 6,741,207 B1 * | 5/2004 | Allison | H01P 1/184 333/164 |
| 7,256,721 B2 * | 8/2007 | Copley | H03M 1/1057 327/553 |

(Continued)

FOREIGN PATENT DOCUMENTS

WO 2017119948 7/2017

OTHER PUBLICATIONS

De La Pinta, Luis, International Search Report and Written Opinion received from the EPO dated May 17, 2017 for appln. No. PCT/US2016/061437, 20 pgs.

(Continued)

*Primary Examiner* — Robert J Pascal
*Assistant Examiner* — Kimberly Glenn
(74) *Attorney, Agent, or Firm* — Jaquez Land Greenhaus LLP; Martin J. Jaquez, Esq.; John Land, Esq.

(57) ABSTRACT

Programmable multi-reflective phase shifters which provide reduced root-mean-square phase error, can be optimized for a desired frequency band, can compensate for process variations arising during manufacture, and can help offset system level performance shortfalls. Embodiments include a hybrid coupler (e.g., a Lange hybrid coupler) in combination with a multi-reflective reactance-based terminating circuit with a number of different configurations that permit various modes of operation, including a thermometric mode, a phase overlap mode with interstitial phase shift states, an extended range phase shift mode, and a "tweak bit" mode. A number of programmable or selectable RF phase shifters can be series or parallel connected to provide a desired gamut of phase shift.

35 Claims, 15 Drawing Sheets

(56) References Cited

U.S. PATENT DOCUMENTS

| | | |
|---|---|---|
| 2005/0040874 A1 | 2/2005 | Allison et al. |
| 2005/0270122 A1 | 12/2005 | Hyman et al. |
| 2010/0327998 A1 | 12/2010 | Jansen et al. |
| 2011/0068843 A1 | 3/2011 | Kodama |
| 2015/0270821 A1 | 9/2015 | Natarajan et al. |

OTHER PUBLICATIONS

Flament, et al., A Combined 4-bit Quadrature Digital to Analog Converter/Mixer for Millimeter-Wave Applications, Electronics, Circuits, and Systems, 2009, ICECS 2009, 16th IEEE International Conference, pp. 964-967.

Klag, Brigitta, Invitation to Pay Additional Fees and, Where Applicable, Protest Fee received from the EPO dated Feb. 22, 2017 for appln. No. PCT/US2016/061437, 7 pgs.

Flament, et al., "A Combined 4-bit Quadrature Digital to Analog Converter/Mixer for Millimeter-Wave Applications", Electronics, Circuits, and Systems, 2009. ICECS 2009, 16th IEEE International Conference, Dec. 13, 2009, pp. 964-967.

"A Very Low Loss 1.9-2.1 GHz RF MEMS Phase Shifter", 2012, 3 pgs.

Vitale, John, "Hybrid Coupler Implemented as a Phase Shifter", Marquette University, e-Publication@Marquette, Master's Thesis, 2009, 88 pgs.

Miyaguchi, et al., "An Ultr-Broad-Band Reflection-Type Phase-Shifter MMIC with Series and Parallel LC Circuits", IEEE Transactions on Microwave Theory and Techniques, vol. 49, No. 12, Dec. 2001, pp. 2446-2452.

Peregrine Semiconductor Corporation, Demand and Amendment filed in the EPO dated Nov. 3, 2017 for appln. No. PCT/US2016/061437, 26 pgs.

De La Pinta, Luis, Written Opinion received from the EPO dated Dec. 15, 2017 for appln. No. PCT/US2016/061437, 11 pgs.

Peregrine Semiconductor Corporation, Response to Written Opinion filed in the EPO dated Feb. 28, 2018 for appln. No. PCT/US2016/061437, 22 pgs.

\* cited by examiner

Hybrid Coupler
(Prior Art)

Reflection Type Phase Shifter
(Prior Art)

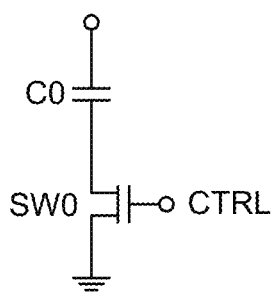
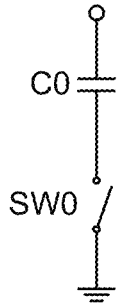
FIG. 3A
(Prior Art)
FIG. 3B
(Prior Art)
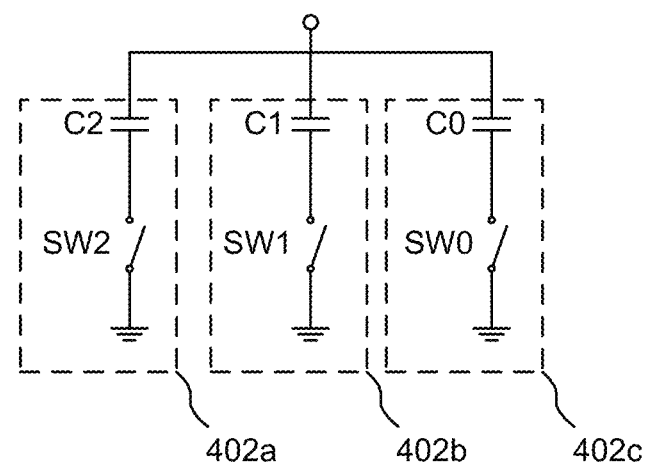
FIG. 4
(Prior Art)

REFLECTION-BASED RF PHASE SHIFTER

BACKGROUND

(1) Technical Field

This invention relates to electronic radio frequency (RF) circuits, and more particularly to programmable multi-reflective RF phase shifter circuits.

(2) Background

It is often necessary to change the phase of RF signals for applications such as in-phase discriminators, beam forming networks, power dividers, linearization of power amplifiers, and phase array antennas, to name a few. RF phase shifters are electronic circuits which can change the phase of an RF signal. One type of RF phase shifter comprises a hybrid coupler and a pair of reflective terminating circuits.

A hybrid coupler is a passive device often used in radio and telecommunications. It is a type of directional coupler where the input power is equally divided between two output ports by electromagnetic coupling; accordingly, it is often called a 3 dB coupler. FIG. 1 is a schematic diagram of a hybrid coupler 100. As is known in the art, directional couplers have four ports. The Input Port is where power is applied. The Coupled Port is where a portion of the power applied to the Input Port appears. The Direct Port is where the power from the Input Port is output, less the portion of the power that went to the Coupled Port. Directional couplers are generally symmetrical, so there also exists a fourth port, the Isolated Port, which is isolated from the Input Port.

One example of a hybrid coupler 100 is the Lange coupler, a four-port, interdigitated structure developed by Dr. Julius Lange around 1969. The electromagnetic coupling among ports in a Lange coupler is derived from closely spaced transmission lines, such as microstrip lines. Lange couplers come in a variety of embodiments and are widely used as power combiners and splitters in RF amplifiers as well as in mixers and modulators. Further details regarding Lange couplers may be found in U.S. Pat. No. 3,516,024, issued on Jun. 2, 1970 to Lange for an "Interdigitated Strip Line Coupler", and also described in Lange, "*Interdigitated Strip-Line Quadrature Hybrid*", MTTS Digest of Technical Papers, Dallas, Tex., May 5-7, 1969, pp. 10-13.

A hybrid coupler can be categorized by five main parameters: bandwidth, insertion loss, coupling ratio, phase shift between ports, and isolation. Bandwidth is defined as the frequency range where the device provides a phase shift within ±10 degrees of the desired phase shift. Insertion loss is the additional loss within the coupler above the loss due to signal splitting. This can be caused by reflections of signals, dielectric losses, and conductor losses. Coupling ratio is defined as the ratio of the lower of the two output powers to the input power. Isolation refers to the ratio between the input power and the leakage power at the Isolated Port.

A reflection-based phase shifter relies on generally identical reactive elements connected to the Direct Port and the Coupled Port of a hybrid coupler. FIG. 2 is a schematic diagram of a reflection-type phase shifter 200 that comprises a broad-band hybrid coupler 100 and a pair of reactive elements in the form of reflective terminating circuits 202, 203. An ideal reactive element has a reflection coefficient of unity (i.e., an ideal non-lossy element). The reflective terminating circuits 200 connected to the Direct Port and the Coupled Port provide reflections of an input signal presented at the Input Port (RF In) which cancel on the Input Port and sum to a phase-shifted version of the input signal on the Isolated Port (RF Out).

By varying the reactance of the reflective terminating circuits 202, 203, the degree of phase shift provided by the reflection-type phase shifter 200 can be controlled. Perhaps the simplest form of reflective terminating circuit 202, 203 is a capacitor. If an arrangement is made to switch the capacitor ON or OFF, then a relative phase shift of $\Delta\emptyset$ can be achieved; expressed in terms of scattering parameters (S-parameters) and phase angle, $\Delta\emptyset$ is:

$$\Delta\emptyset = S_{11} \angle \emptyset(ON) - S_{11} \angle \emptyset(OFF)$$

where $S_{11}$ is the voltage reflection coefficient of the Input Port.

FIG. 3A is a schematic diagram of a simple reflective terminating circuit 300 comprising a capacitor C0 that may be switched into or out of circuit by a field-effect transistor (FET) switch SW0 coupled to circuit ground. The FET switch SW0 is controlled by a CTRL signal supplied by other circuitry (not shown). FIG. 3B is a simplified schematic diagram of the circuit 300 of FIG. 3A in which the FET switch SW0 is represented as a single-pole, single-throw switch (the CTRL signal is implicit).

FIG. 4 is a schematic diagram of a multi-reflective terminating circuit 400 comprising three parallel capacitor/switch units 402a-402c that each comprise a capacitor C0-C2 and corresponding switch SW0-SW2; the values of the capacitors C0-C2 may vary. By selectively switching the capacitors C0-C2 in or out of circuit, the amount of reactance coupled to the hybrid coupler 100 (see FIG. 2) can be varied, thus providing a selectable amount of phase shift.

A challenge in designing multi-reflective phase shifters is achieving digitally controlled multiple equidistant phase shifts such that needed capacitance values increase uniformly, while taking into account the capacitance of each capacitor/switch unit's phase shift contribution (which is affected by loading of its own OFF state phase value as well as by the ON or OFF state of other capacitor/switch units 402a-402c). More generally, such a design challenged extends to achieving digitally controlled multiple equidistant phase shifts such that applied reactance values increase uniformly.

The present invention addresses these issues by teaching a number of novel concepts for improved multi-reflective RF phase shifters.

SUMMARY OF THE INVENTION

The invention encompasses various embodiments of programmable multi-reflective phase shifters which provide reduced root-mean-square (RMS) phase error, can be optimized for a desired frequency band, can compensate for process variations arising during manufacture, and can help offset system level performance shortfalls.

One aspect of the invention includes multiple FET-based reactive elements which can be combined in a pair of reflective terminating circuits for use in conjunction with a hybrid coupler to create a programmable multi-reflective RF phase shifter circuit controlled in a thermometric fashion to generate multiple yet equal phase shift increments.

Another aspect of the invention includes an optional mode for a multi-reflective phase shifter that allows generation of interstitial phase shift states as well as purely thermometric phase shifts in a phase overlap mode. A further aspect of this concept is overprovisioning the number of phase state bits in order to operate in a purely thermometric coding manner by mapping the phase state bits to combinations of control lines that best provide evenly spaced phase shifts.

Yet another aspect of the invention includes a phase shifter that has multiple switchable reactive elements with progressively increasing reactance values, thereby permitting an extended range phase shift mode of operation.

Another aspect of the invention includes use of reactive elements added to provide for "tweaking" the performance of a phase shifter by allowing small adjustments in circuit capacitance and/or inductance under the control of "tweak bits" in order to achieve small amounts of phase shift. Tweak bit capability enables the following benefits: (1) fine-tuning of the frequency band for optimum phase shift; (2) offsetting (re-tuning) performance shifts from nominal values due to confounding factors, including variations in the semiconductor fabrication process; and/or (3) intentionally adding a mismatch between the multi-reflective terminating circuits for the purpose of balancing overall performance of the phase shifter.

A number of programmable multi-reflective RF phase shifters of the types described in this disclosure, with different phase shift increments, can be series or parallel connected to provide a desired gamut of phase shift. Such combinations can include other types of phase shifters and/or non-multi reflective phase shifters to enable an even greater phase shift gamut.

There are numerous advantages to embodying the programmable multi-reflective phase shifter concepts described in this disclosure in CMOS ICs using stacked FET switches fabricated with a silicon-on-insulator (SOI) process (which includes silicon-on-sapphire, or SOS).

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 3A is a schematic diagram of a simple reflective terminating circuit comprising a capacitor that may be switched into or out of circuit by a field-effect transistor (FET) switch coupled to circuit ground.

FIG. 3B is a simplified schematic diagram of the circuit of FIG. 3A in which the FET switch is represented as a single-pole, single-throw switch.

FIG. 4 is a schematic diagram of a multi-reflective terminating circuit comprising three parallel capacitor/switch units that each comprise a capacitor and corresponding switch.

FIG. 23B is a graph of a curve showing a mapping of correction "deltas" as a function of frequency for a selected base center frequency (in GHz) for the left side of the curve shown in FIG. 23A.

FIG. 23C is a graph of a curve showing a mapping of correction "deltas" as a function of frequency (in GHz) for a selected base center frequency for the right side of the curve shown in FIG. 23A.

Like reference numbers and designations in the various drawings indicate like elements.

DETAILED DESCRIPTION OF THE INVENTION

The invention encompasses various embodiments of multi-reflective phase shifters which provide reduced root-mean-square (RMS) phase error, which can be optimized for a desired frequency band, which can compensate for process variations arising during manufacture, and which can help offset system level performance shortfalls.

Thermometric Coding for Equidistant Phasor Generation

Use of a single hybrid coupler with multiple switchable reactive elements to achieve multiple equidistant phase shifts is difficult with conventional designs because capacitance (or, more generally, reactance) values do not increase uniformly, and each switchable reactive element is affected by loading of its own OFF state phase value as well as the particular ON/OFF state of other switchable reactive elements. A close consideration of the circuit shown in FIG. 4 for switching capacitor-based reactive elements into and out of circuit discloses that a simple binary scheme for controlling such reactive elements has deficiencies for these reasons.

One aspect of the invention utilizes a single hybrid coupler (e.g., a Lange coupler) in combination with multiple switchable reactive elements such that the set of reactive elements are controlled in a thermometric (i.e., sequentially additive/subtractive) fashion to generate multiple yet equal phase shift increments, where each reactive element's OFF and ON states are very well defined. A Lange coupler is particularly useful in many applications due to its beneficial low voltage standing wave ratio (VSWR) and broadband frequency characteristics.

Figure 1:
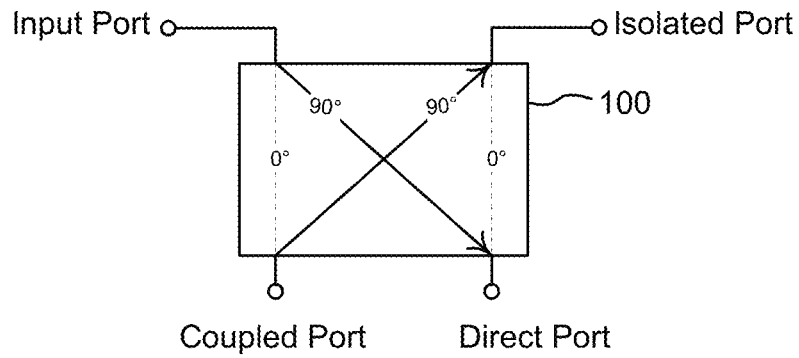
FIG. 1 is a schematic diagram of a hybrid coupler.
Figure 2:
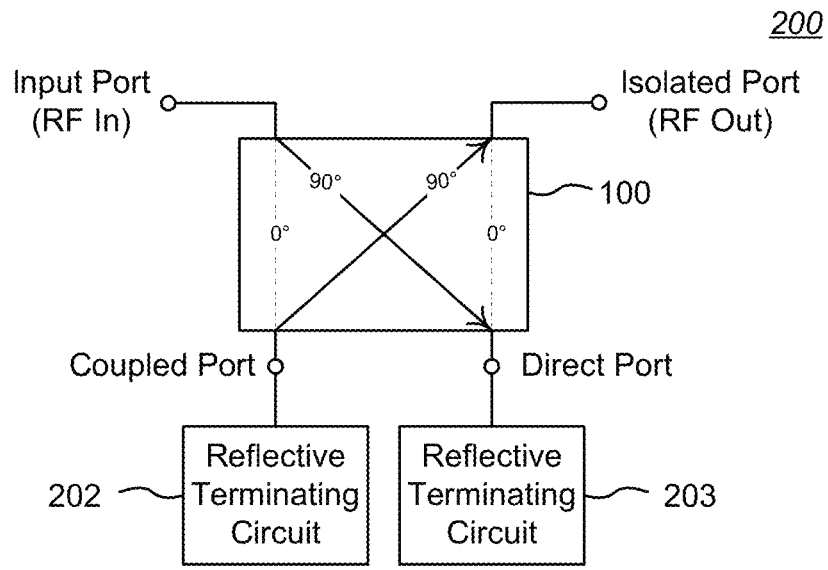
FIG. 2 is a schematic diagram of a reflection-type phase shifter that comprises a broadband hybrid coupler and a pair of reactive elements in the form of reflective terminating circuits.
Figure 5A:
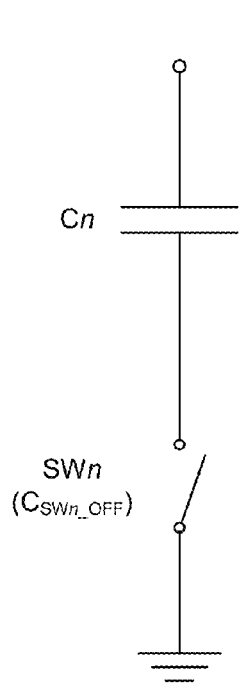
FIG. 5A is a simplified schematic diagram of a reflective terminating circuit comprising a FET switch SWn and a capacitor Cn in series connection.
Figure 5B:
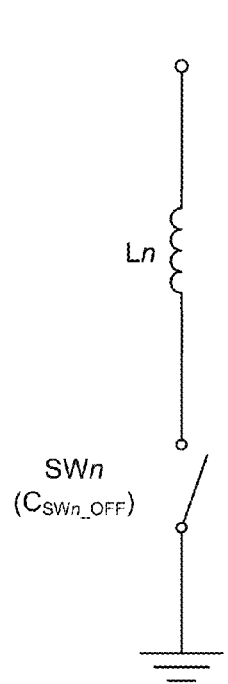
FIG. 5B is a simplified schematic diagram of a reflective terminating circuit comprising a FET switch SWn and an inductor Ln in series connection.

In some embodiments of reflective terminating circuits, the multiple switchable reactive elements may be implemented as FET-based capacitor/switch reactive elements or as FET-based inductor/switch reactive elements, or a combination of both. For example, FIG. 5A is a simplified schematic diagram of a reflective terminating circuit 500 comprising a FET switch SWn and a capacitor Cn in series connection. Similarly, FIG. 5B is a simplified schematic diagram of a reflective terminating circuit 502 comprising a FET switch SWn and an inductor Ln in series connection.

With current technology, a FET-based embodiment of a reactive element never has zero capacitance. For example, referring to FIG. 5A, when the FET switch SWn is closed (i.e., in a conductive state, or "ON"), the capacitance $C_{ON}$ of the ON-state reflective terminating circuit 500 is simply the capacitance of the capacitor Cn; thus, $C_{ON}$=Cn. However, when the FET switch SWn is open (i.e., in a non-conductive state, or "OFF"), the FET switch SWn has a capacitance of $C_{SWn\_OFF}$, and the capacitance $C_{OFF}$ of the OFF-state reflective terminating circuit 500 is more complex: $C_{OFF}$= (Cn*$C_{SWn\_OFF}$)/(Cn+$C_{SWn\_OFF}$).

Note that the capacitor Cn in FIG. 5A may be implemented as a FET configured to be OFF all of the time, thus behaving like a capacitor with capacitance $C_{OFF}$. Alternatively, both Cn and SWn may be switchable FETs (preferably with different $C_{OFF}$ values), but with at least one switched OFF (thus behaving only as a capacitor) at any one time. Such a configuration would enable one capacitor/switch terminating circuit 500 to have three different degrees of phase shift due to different combinations of $C_{OFF}$ values (i.e., a first FET OFF and a second FET ON, the first FET ON and the second FET OFF, and both FETs OFF).

Figure 5C:
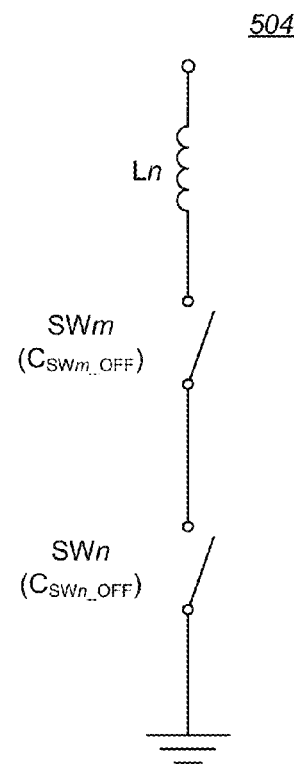
FIG. 5C is a simplified schematic diagram of a reflective terminating circuit comprising a first FET switch SWn, a second FET switch SWm, and an inductor Ln in series connection.

As another example, FIG. 5C is a simplified schematic diagram of a reflective terminating circuit 504 comprising a first FET switch SWn, a second FET switch SWm, and an inductor Ln in series connection. Since the first and second FET switches may be modeled as resistors Rn, Rm when ON and as capacitors Cn, Cm when OFF, such a configuration allows four distinct series configurations: (1) RnRmLn; (2) RnCmLn; (3) CnRmLn; and (4) CnCmLn. Of course, other combinations of switchable components that selectively affect signal phase may be used as reactive elements, including multiple switched transmission lines, variable length transmissions lines, and more elaborate combinations of capacitors and inductors.

Figure 6:
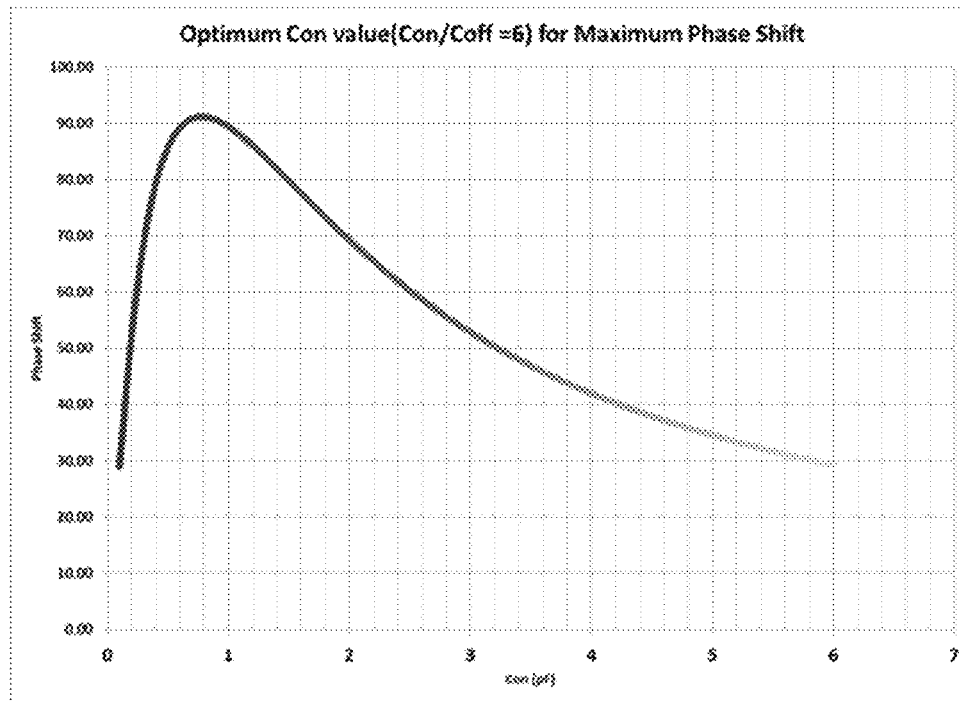
FIG. 6 is a graph showing phase shift as a function of $C_{ON}$ for a selected ratio of $C_{ON}$ to $C_{OFF}$ for one example embodiment.

Considering the equations for $C_{ON}$ and $C_{OFF}$, it is clear that a change in Cn affects both capacitance values when a second capacitor is included in a reactive element of a reflective terminating circuit. An important realization is that it is useful to consider the ratio of $C_{ON}$ to $C_{OFF}$ and the effect on phase shift of a particular ratio. For example, FIG. 6 is a graph showing phase shift as a function of $C_{ON}$ for a selected ratio of $C_{ON}$ to $C_{OFF}$ for one example embodiment. As can be seen in this particular example, the optimum value of $C_{ON}$ required to achieve a maximum phase shift is about 0.8 pf when the ratio $C_{ON}/C_{OFF}$ is set to 6.

Figure 7:
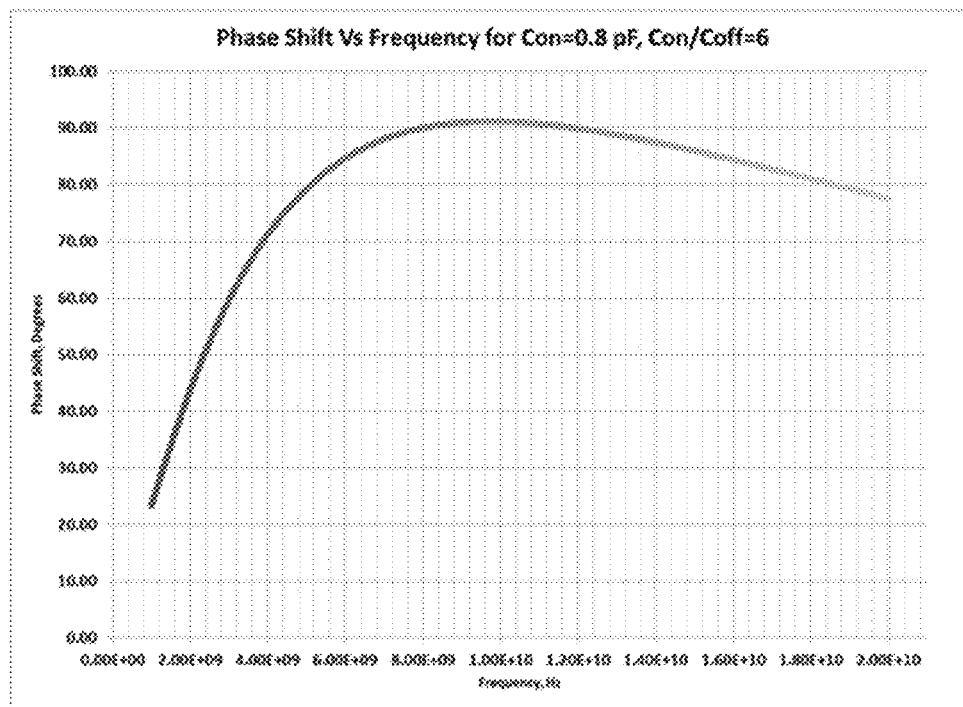
FIG. 7 is a graph of phase shift as a function of frequency for a selected $C_{ON}$ (0.8 pf in this example) and $C_{ON}/C_{OFF}$ ratio (6 in this example) for one example embodiment.

Another important realization is that optimizing the frequency response of a reflective terminating circuit requires taking the $C_{ON}$ and $C_{OFF}$ relationship into account. FIG. 7 is a graph of phase shift as a function of frequency for a selected $C_{ON}$ (0.8 pf in this example) and $C_{ON}/C_{OFF}$ ratio (6 in this example) for one example embodiment. For a selected $C_{ON}/C_{OFF}$ ratio, modelling or testing various values of $C_{ON}$ to determine the value required to achieve a maximum phase shift (as in FIG. 6) enables modelling or testing with the determined value to determine the frequency response of the selected combination (as in FIG. 7). In general, a broadband response is achieved only with a particular $C_{ON}$ value for a selected $C_{ON}/C_{OFF}$ ratio within a "sweet spot" frequency range. In general, if the $C_{ON}/C_{OFF}$ ratio is kept the same but a very low value of $C_{ON}$ is used, there is a minimal phase shift at low frequencies; similarly, if too high a value of $C_{ON}$ is used, there is minimal phase shift at higher frequencies.

Figure 8:
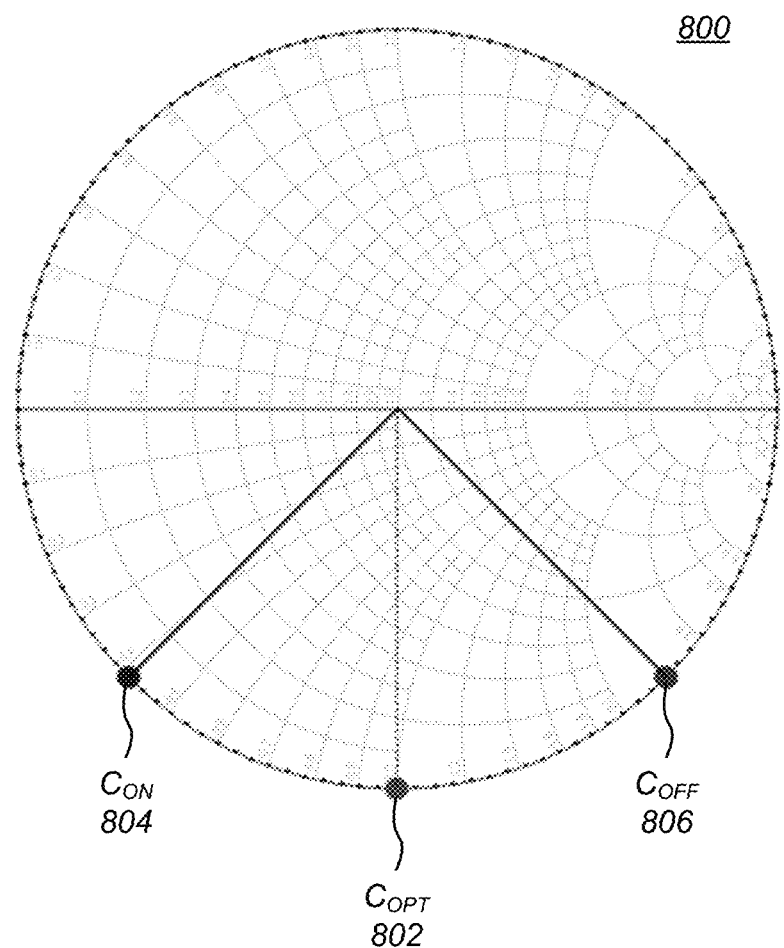
FIG. 8 is a Smith chart plotting $C_{OPT}$ and equidistantly placed values for $C_{ON}$ and $C_{OFF}$ for a characteristic impedance of 50 Ohms.

For a selected characteristic impedance (e.g., 50 Ohms), an optimum value $C_{OPT}$ can be defined where the reactance $X_{Copt}$ at a center frequency Fc equals the selected characteristic impedance. For example, to achieve a broadband 90° phase shift for a FET-based reflective terminating circuit that includes a capacitive component, $C_{ON}$ and $C_{OFF}$ should be placed essentially equidistantly from the $C_{OPT}$ point in a Smith chart. FIG. 8 is a Smith chart 800 plotting $C_{OPT}$ 802 and equidistantly placed values for $C_{ON}$ 804 and $C_{OFF}$: 806 for a characteristic impedance of 50 Ohms. In a more general phasor representation, for a desired reflection coefficient Γ (gamma) at Fc, the plot values are as follows:

$$\Gamma(C_{OPT}) = 1 \cdot e^{j(-90)}$$

$$\Gamma(C_{ON}) = 1 \cdot e^{j(-90-\theta)}$$

$$\Gamma(C_{OFF}) = 1 \cdot e^{j(-90+\theta)}$$

With these values, the desired phase shift is 2*θ. Utilizing this method for other desired phase shifts (e.g., steps of 45°, 22.5°, 11.25°, or 5.625°), capacitance values can be determined for $C_{ON}$ and $C_{OFF}$ of additional FET-based capacitor/switch reactive elements. A similar analysis and determination can be made with respect to inductance values for FET-based inductor/switch reactive elements.

Figure 9:
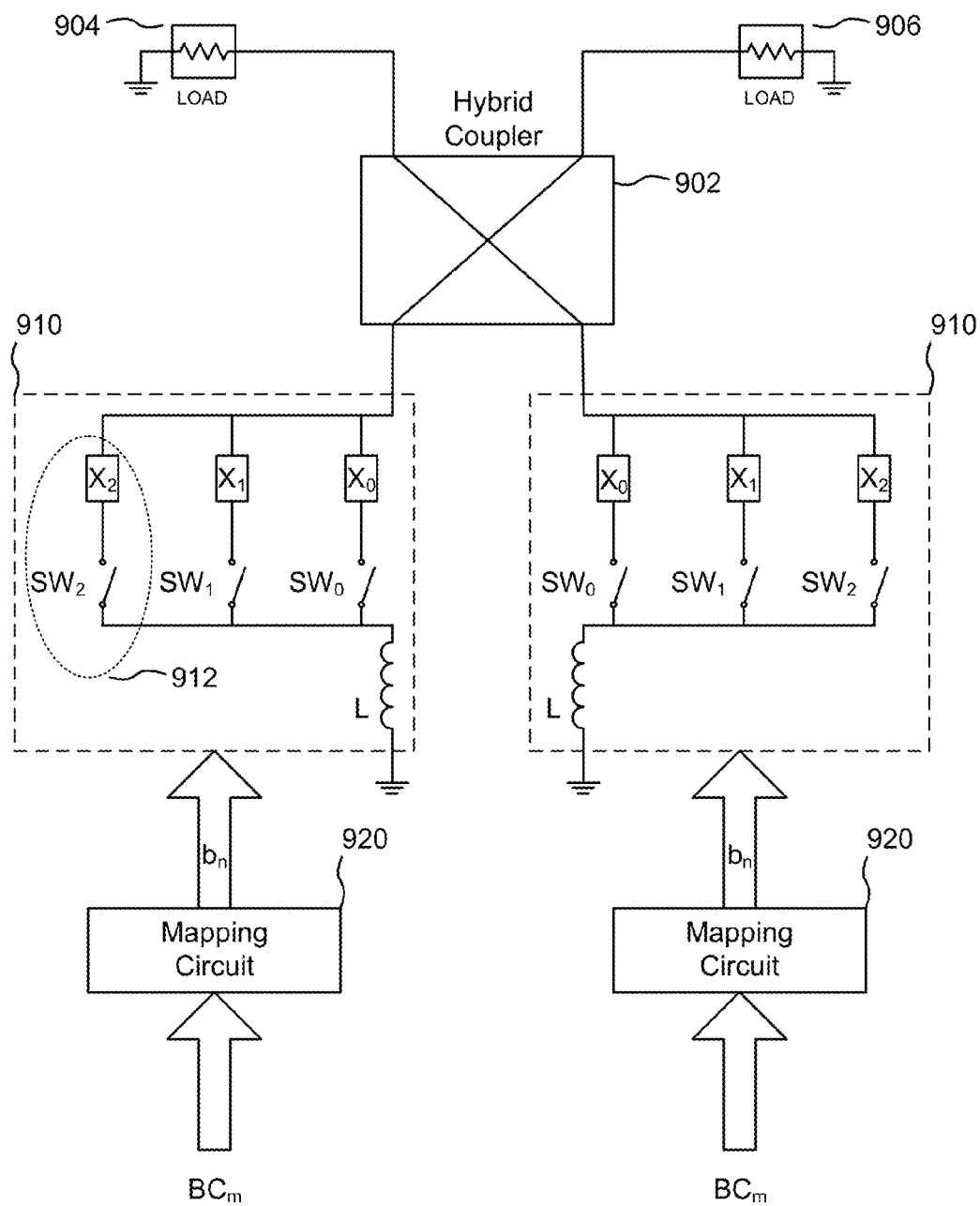
FIG. 9 is a schematic diagram of one embodiment of a thermometrically-controlled programmable multi-reflective RF phase shifter.

Multiple FET-based switchable reactive elements (e.g., of the type shown in FIGS. 5A-5C) can be combined in a pair of reflective terminating circuits for use in conjunction with a hybrid coupler to create a programmable multi-reflective RF phase shifter circuit controlled in a thermometric fashion to generate multiple yet equal phase shift increments. FIG. 9 is a schematic diagram of one embodiment of a thermometrically-controlled programmable multi-reflective RF phase shifter 900. A conventional hybrid coupler (e.g., a Lange coupler) 902 is coupled to an RFin load 904 and an RFout load 906, as well as to generally identical (in structure and component values) multi-reflective terminating circuits 910 (but see the discussion below regarding non-identical multi-reflective terminating circuits). Each multi-reflective terminating circuit 910 includes n switchable reactive elements 912 each comprising at least one reactive element Xn series connected to at least one corresponding switch SWn, where n is one or more (3 are shown by way of example). One switchable reactive element 912 is circled in dotted outline as a "leg" of a corresponding multi-reflective terminating circuits 910, and other examples are shown in FIGS. 5A-5B. Other combinations of switchable components that selectively affect signal phase may be used as reactive elements within the multi-reflective terminating circuits 910, including multiple switched transmission lines, variable length transmissions lines, and more elaborate combinations of capacitors and inductors.

FIG. 9 also shows parasitic ground inductance modeled as a discrete inductor L. However, this inductance L may also be optimally configured (by suitable augmentation and/or component layout) to optimize the phase shift response of the RF phase shifter 900 and increase the phase shift range (taking into account possible adverse effects on the bandwidth of the circuit).

The following relationships hold true for the n illustrated switchable reactive elements 912 of each multi-reflective terminating circuit 910 that contain a FET switch SWn and a capacitance Cn (i.e., a capacitor or a FET configured as a capacitor), such as the circuit 500 shown in FIG. 5A: $Cn_{ON} = Cn$ and $Cn_{OFF} = (Cn*C_{SWn\_OFF})/(Cn+C_{SWn\_OFF})$. As one example, each of the switchable reactive element 912 "legs" with such a capacitor configuration may have a $C_{ON}$ of about 0.26 pF, and a $C_{ON}/C_{OFF}$ ratio of about 5 per leg. With those values and three "legs" per reflective terminating circuit 910, the maximum phase shift is achieved when all of the capacitances Cn are turned on (~0.8 pF) with respect to a reference state when all capacitances Cn are OFF (~0.134 pF). For this case, $C_{ON\_total}/C_{OFF\_total} = ~6$ for all six legs combined. As shown in FIG. 6 and FIG. 7, such a configuration provides a broadband maximum phase shift of 90°.

Switch Control

The FET switches SWn of the switchable reactive elements 912 are individually controllable by the application of control signals to respective control lines bn (the details of control line to switch connection are not shown but are well known). In the illustrated embodiment, the bn control lines are thermometrically mapped to m binary phase state (PS) control bits defining a phase shift; however, in an alternative embodiment, the bn control lines may be directly controlled by external circuitry in a thermometric mode. The PS control bits and/or direct control bits may be provided, for example, through the well-known serial peripheral interface (SPI) bus.

Mapping of PS control bits to bn control lines may be accomplished by a mapping circuit 920, such as dedicated combinatorial logic or a lookup table, in known fashion. As one example, if m=2 and n=3, then two PS control bits can be thermometrically mapped to three control lines b2-b0 as shown in TABLE 1:

TABLE 1

| PS Bits | b2 | b1 | b0 |
|---|---|---|---|
| 00 | 0 | 0 | 0 |
| 01 | 0 | 0 | 1 |
| 10 | 0 | 1 | 1 |
| 11 | 1 | 1 | 1 |

Thus, for phase state $PS_{00}$, all FET switches SWn are OFF. Then, progressively (in the manner of a thermometer), for phase state $PS_{01}$, only switch $SW_0$ is ON; for phase state $PS_{10}$, only switches $SW_0$ and $SW_1$ are ON; and for phase state $PS_{11}$, all switches $SW_0$-$SW_2$ are ON. Accordingly, the reactance value of the entire chain of reactive elements is successively increased to result in an equidistant phase shift.

Capacitor-Based Multi-Reflective Terminating Circuit Embodiments

The following discussion uses multi-reflective terminating circuits 910 implemented with capacitors Cn as the phase-change reactive elements Xn within the switchable reactive elements 912, similar to the capacitor/switch structure shown in FIG. 5A as an example. A corresponding discussion would apply to multi-reflective terminating circuits 910 implemented with other types of reactive elements Xn (e.g., inductors, transmission lines) used as the principal phase-change components of the switchable reactive elements 912.

Expressed in terms of a "REF" (for "reference") state and an "ON" state, and using the terminology stated above for the ON and OFF capacitance of each capacitor/switch reactive element 912 of each multi-reflective terminating circuit 910 (i.e., $Cn_{ON}$ and $Cn_{OFF}$), the change in capacitance from reference state to ON state can be expressed as set forth in TABLE 2:

TABLE 2

$PS_{01\_REF} = C0_{OFF} + C1_{OFF} + C2_{OFF}$
$PS_{01\_ON} = C0_{ON} = C0$
$PS_{10\_REF} = C0_{ON} + C1_{OFF} + C2_{OFF}$
$PS_{10\_ON} = C1_{ON} = C1$
$PS_{11\_REF} = C0_{ON} + C1_{ON} + C2_{OFF}$
$PS_{11\_ON} = C2_{ON} = C2$

TABLE 3 sets forth the capacitance values of a multi-reflective terminating circuit 910 for each phase state (REF and ON) for a specific circuit example that achieves three phase shifts in increments of 22.5° (the difference in each case between the $C_{OFF}$ and the $C_{ON}$ phase states), where $C_{OPT}$ at 10 GHz=0.31 pf, providing an S11 parameter phase of 90° at 10 GHz; the other capacitance values swing symmetrically across this $C_{OPT}$.

TABLE 3

| PS Bits | b2 | b1 | b0 | $C_{ON}$ (pF) | $C_{OFF}$ (pF) | Phase Shift |
|---------|----|----|----|---------------|----------------|-------------|
| 00      | 0  | 0  | 0  | 0.17          | NA             | Reference   |
| 01      | 0  | 0  | 1  | 0.26          | 0.17           | 22.5°       |
| 10      | 0  | 1  | 1  | 0.39          | 0.26           | 22.5°       |
| 11      | 1  | 1  | 1  | 0.6           | 0.39           | 22.5°       |

Thus, from TABLE 3, the following values achieve desired uniform phase shifts of 22.5° for this example:

TABLE 4

$PS_{01\_REF} = 0.17$ pF
$PS_{10\_REF} = 0.26$ pF
$PS_{11\_REF} = 0.39$ pF
$PS_{11\_ON} = 0.6$ pF

Figure 10:
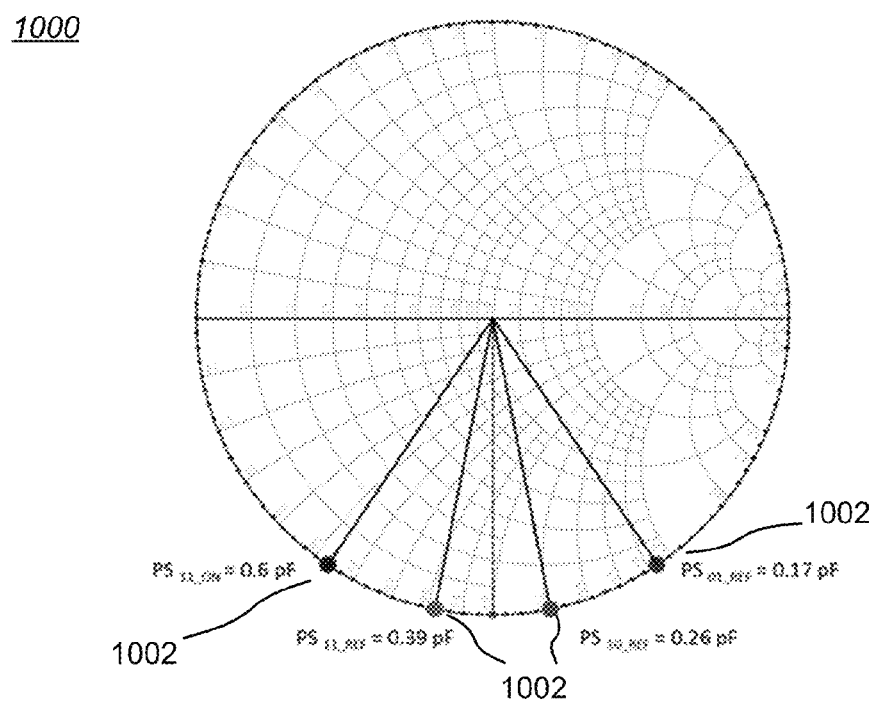
FIG. 10 is a Smith chart plotting the optimum location of capacitance locations that result in phase shifting in increments of 22.5°.

While the total capacitance differences from phase state to phase state are not uniform, the phase shifts are uniform as a result of properly offsetting the sizing of capacitor and switch components in different legs of the switchable reactive elements 912. The necessary capacitance values for a particular design can be determined graphically, or by an iterative modelling or testing process. For example, FIG. 10 is a Smith chart 1000 plotting the optimum location of capacitance values 1002 that result in phase shifting in increments of 22.5°, corresponding to the 3-bit thermometric example in TABLE 3 above; the dotted line indicates the central $C_{OPT}$ point. As noted above, the phase shift increment may have other values, such as 45°, 11.25°, or 5.625°. (Note also that the precision of phase shift is dependent on the quality of the components, circuit design and layout, and fabrication process, and thus the phase shift for any state may vary from the designed value; accordingly, the amount of phase shift actually achieved in any particular state for the embodiments described herein may vary somewhat from the stated values). This concept of an optimum Smith chart location applies to determining reactance values in general, and thus would apply to the opposite, positive side of the Smith chart to determine a corresponding $L_{OPT}$—for example, when using switchable inductor-based reactive elements 912.

Figure 11:
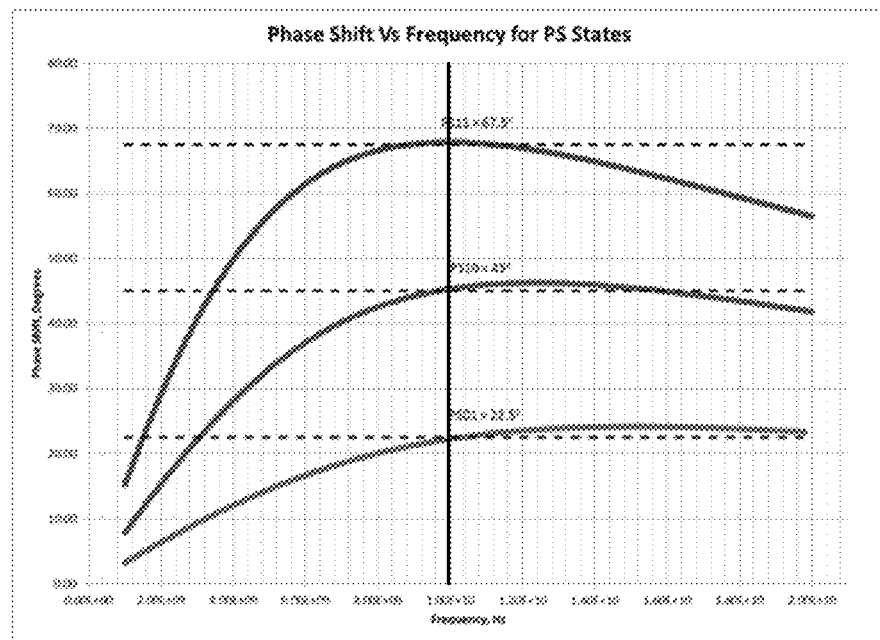
FIG. 11 is a graph showing the broadband phase shift versus frequency response for the specific circuit values shown in TABLE 3 for a 22.5° programmable phase shifter.

FIG. 11 is a graph 1100 showing the broadband phase shift versus frequency response for the specific circuit values shown in TABLE 3 for a 22.5° programmable thermometric phase shifter. From the graph, it is clear that the optimum bandwidth (centered around 10 GHz) is geared towards achieving a 67.5° phase shift, since the 22.5° and 45° phase shifts have their respective optimums at higher frequency; this is because the selected phase shift capacitance values do not swing symmetrically across the $C_{OPT}$ point.

Figure 12:
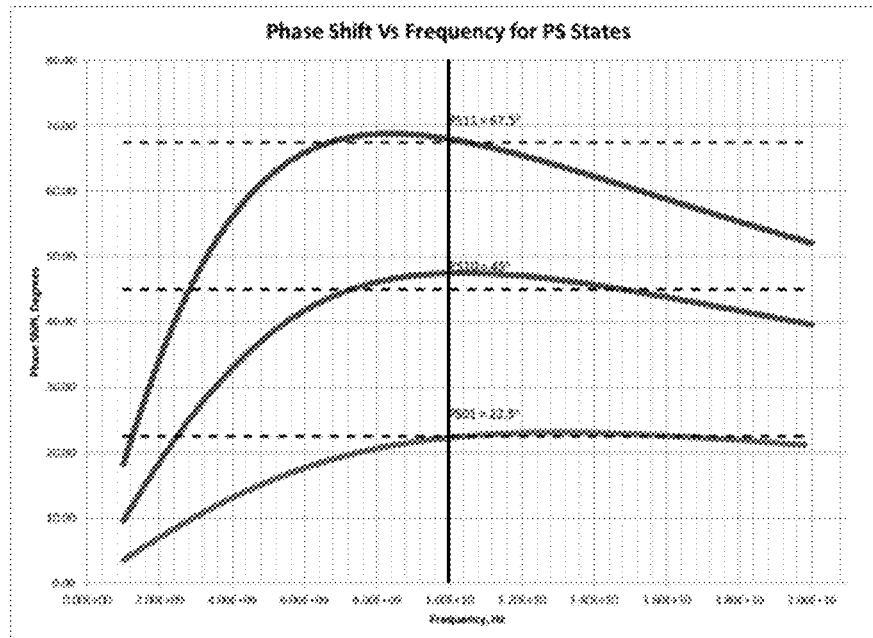
FIG. 12 is a graph showing the broadband phase shift versus frequency response for slightly optimized specific circuit values shown in TABLE 4 for a 22.5° programmable phase shifter.

FIG. 12 is a graph 1200 showing the broadband phase shift versus frequency response for slightly optimized specific circuit values shown in TABLE 4 for a 22.5° programmable thermometric phase shifter. In this example, the 45° phase shift has the optimum bandwidth (again centered around 10 GHz), while the 22.5° and 67.5° phase shifts are made to swing opposite across the 10 GHz point (i.e., each curve has a maximum on opposite sides of the 10 GHz point). The values shown in TABLE 5 and TABLE 6 below were used to achieve this particular variant embodiment:

TABLE 5

$PS_{01\_REF} = 0.2$ pF
$PS_{10\_REF} = 0.3$ pF

TABLE 5-continued $PS_{11\_REF} = 0.47$ pF
$PS_{11\_ON} = 0.73$ pF

TABLE 6

| PS Bits | b2 | b1 | b0 | $C_{ON}$ (pF) | $C_{OFF}$ (pF) | Phase Shift |
|---------|----|----|----|---------------|----------------|-------------|
| 00      | 0  | 0  | 0  | 0.2           | NA             | Reference   |
| 01      | 0  | 0  | 1  | 0.3           | 0.2            | 22.5°       |
| 10      | 0  | 1  | 1  | 0.47          | 0.3            | 22.5°       |
| 11      | 1  | 1  | 1  | 0.73          | 0.47           | 22.5°       |

Satisfying all these capacitance values generally (and, more generally reactance values) requires an iterative process and can involve an optimizer program.

This aspect of the invention includes a method for programmably phase shifting an RF signal in multiple equidistant phase shifts, including:

providing a hybrid coupler having an input port, an output port, a coupled port, and a direct port;

providing first and second multi-reflective terminating circuits coupled respectively to the coupled port and the direct port of the hybrid coupler, each reflective terminating circuit including two or more switchable reactive elements; and sequentially controlling the switchable reactive elements by means of thermometric coding so as to generate multiple equidistant phase shifts of a signal applied to the input port of the hybrid coupler.

Phase Overlap Mode

In the capacitor-based multi-reflective terminating circuit embodiment discussed above, capacitors Cn were used as the reactive elements Xn within the switchable reactive elements 912 shown in FIG. 9. Using the values shown in TABLE 6, the capacitance of the multi-reflective terminating circuits 910 was varied in a manner that allowed an incremental 22.5° of phase shift while stepping through four phase states using thermometric coding. However, the same circuit configuration can also be used in an alternative manner that also applies to other types of phase-change reactive elements Xn (e.g., inductors, transmission lines). In particular, if the number of m binary phase state control bits PS defining a phase shift (PS) state is set to match or exceed the bn control lines (e.g., m=n, or a direct mapping of control bits to control lines), all of the individual control lines can be controlled in any combination, rather than only sequentially activated. Such a configuration would allow the circuit to cover more points between the minimum and maximum amounts of phase shift (i.e., between 22.5° and 67.5° in the illustrated embodiment); that is, the minimum and maximum phase shift values would remain the same as in the mapped example shown in TABLE 6, but more points or phase shift "overlap" can be achieved.

As an example, continuing to use capacitor-based switchable reactive elements 912 for illustration, and continuing with the particular values shown in TABLE 6, three binary phase state (PS) control bits can directly control the three control lines $b_n$ and define 8 phase state values; a specific example is set forth in TABLE 8 below, in which the phase shift for each state is compared to the reference state with all switches being OFF (hence the identical $C_{OFF}$ values in each row):

TABLE 8

| | PS Bits | b2 | b1 | b0 | $C_{ON}$ (pF) | $C_{OFF}$ (pF) | Phase Shift |
|---|---|---|---|---|---|---|---|
| | 000 | 0 | 0 | 0 | 0.19 | NA | Reference |
| T | 001 | 0 | 0 | 1 | 0.30 | 0.19 | 22.5° |
| | 010 | 0 | 1 | 0 | 0.37 | 0.19 | 35° |
| T | 011 | 0 | 1 | 1 | 0.47 | 0.19 | 45° |
| | 100 | 1 | 0 | 0 | 0.45 | 0.19 | 42° |
| | 101 | 1 | 0 | 1 | 0.56 | 0.19 | 56° |
| | 110 | 1 | 1 | 0 | 0.63 | 0.19 | 62° |
| T | 111 | 1 | 1 | 1 | 0.73 | 0.19 | 67.5° |

TABLE 9

| | PS Bits | b2 | b1 | b0 | $C_{ON}$ (pF) | $C_{OFF}$ (pF) | Phase Shift |
|---|---|---|---|---|---|---|---|
| | 000 | 0 | 0 | 0 | 0.19 | NA | Reference |
| T | 001 | 0 | 0 | 1 | 0.30 | 0.19 | 22.5° |
| | 010 | 0 | 1 | 0 | 0.37 | 0.19 | 35° |
| T | 011 | 0 | 1 | 1 | 0.47 | 0.19 | 40° |
| $T_0$ | 100 | 1 | 0 | 0 | 0.45 | 0.19 | 45° |
| | 101 | 1 | 0 | 1 | 0.56 | 0.19 | 56° |
| | 110 | 1 | 1 | 0 | 0.63 | 0.19 | 62° |
| T | 111 | 1 | 1 | 1 | 0.73 | 0.19 | 67.5° |

The table rows marked at the left-most column with "T" indicate PS bit states that exactly produce thermometrically coded states for the control lines $b_n$, as in TABLE 6. Further, by allowing additional PS bit states in an optional operational mode, "interstitial" phase shifts can be generated by the same circuit, each providing an increasing phase shift from the reference state. This extra phase shift overlap allows the phase shifter 900 to be set to a finer phase resolution and improve RMS phase error.

Figure 13:
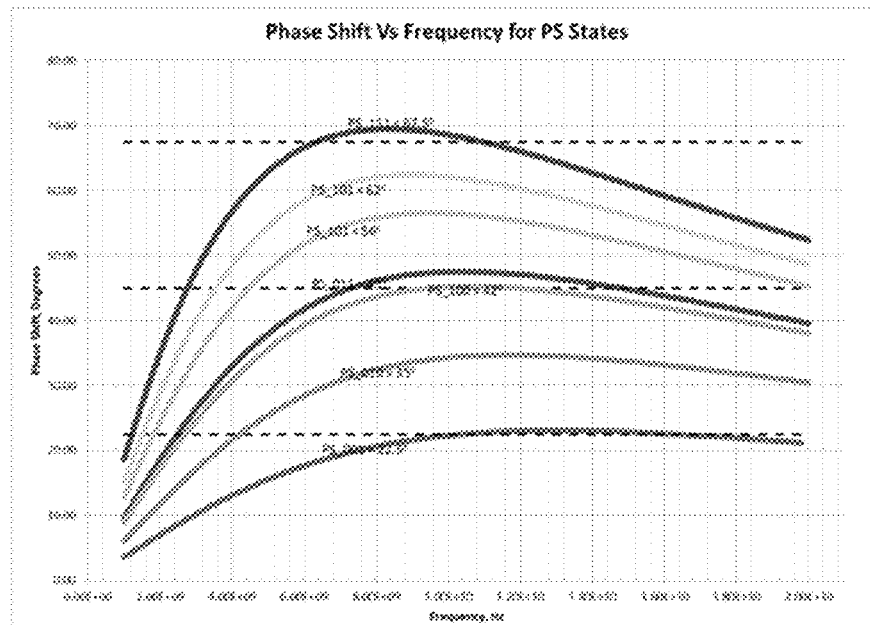
FIG. 13 is a graph showing the broadband phase shift versus frequency response for the specific circuit values shown in TABLE 8 for a programmable phase shifter operating in a phase overlap mode.

FIG. 13 is a graph 1300 showing the broadband phase shift versus frequency response for the specific circuit values shown in TABLE 8 for a programmable phase shifter operating in a phase overlap mode. As can be seen, evenly spaced phase shifts of 22.5° can be achieved by limiting the PS bit states to values "001", "011", and "111", while additional interstitial or overlap phase shifts can be generated with other bit combinations if the phase shifter 900 is used in the optional phase overlap operational mode.

This aspect of the invention includes a method for programmably phase shifting an RF signal in multiple equidistant phase shifts, including:
   providing a hybrid coupler having an input port, an output port, a coupled port, and a direct port;
   providing first and second multi-reflective terminating circuits coupled respectively to the coupled port and the direct port of the hybrid coupler, each reflective terminating circuit including two or more switchable reactive elements;
   sequentially controlling the switchable reactive elements by means of thermometric coding so as to generate multiple equidistant phase shifts of a signal applied to the input port of the hybrid coupler; and
   controlling the switchable reactive elements so as to generate at least one interstitial phase shift of the signal applied to the input port of the hybrid coupler.

Overprovisioned Control Bit Configuration

Still another mode of operation for the circuit embodiment shown in FIG. 9 is to operate in a purely thermometric coding manner, but map the PS bits to combinations of the control lines $b_n$ that best provide evenly spaced phase shifts. This may be useful, for example, where process variations or other confounding factors cause the circuit to not behave quite as designed. For example, once again using capacitor-based switchable reactive elements 912 for illustration, calibration testing of one example phase shifter 900 might result in values such as those shown in TABLE 9. In TABLE 9, the nominal thermometric coding to achieve evenly spaced phase shifts of 22.5° is off at the PS bit state of "011", achieving only 40° of phase shift (see rows marked with "T" at the left). However, it turns out in this example that the PS bit state of "100" achieves the desired 45° of phase shift (see row marked with "$T_0$" at the left). Accordingly, the mapping circuit 920 can be configured to map the PS bits to control lines $b_n$ as shown in TABLE 10 to provide a corrected phase shift mapping and achieve the desired thermometric coding.

TABLE 10

| | Nominal Mapping | | | | Corrected Mapping | | | |
|---|---|---|---|---|---|---|---|---|
| PS Bits | b2 | b1 | b0 | Phase Shift | b2 | b1 | b0 | Phase Shift |
| 000 | 0 | 0 | 0 | Reference | 0 | 0 | 0 | Reference |
| 001 | 0 | 0 | 1 | 22.5° | 0 | 0 | 1 | 22.5° |
| 011 | 0 | 1 | 1 | 40° | 1 | 0 | 0 | 45° |
| 111 | 1 | 1 | 1 | 67.5° | 1 | 1 | 1 | 67.5° |

Thus, by using extra phase state (PS) control bits (i.e., overprovisioning PS bits), certain bit states can be "thrown away" in order to select and map the bit states that provide the highest level of phase shift accuracy when mapped to control lines. Moreover, because the amount of phase shift is frequency dependent (see, for example, FIG. 13), it may be useful to have different mappings of PS bits to control lines $b_n$ for different frequencies to improve phase shift accuracy. This may be accomplished, for example, by configuring the mapping circuit 920 with different lookup tables or sets of combinatorial logic circuits, with a specific table or set being selected by an externally supplied control signal or by a frequency detection circuit.

This aspect of the invention includes a method for programmably phase shifting an RF signal in multiple equidistant phase shifts, including:
   providing a hybrid coupler having an input port, an output port, a coupled port, and a direct port;
   providing first and second multi-reflective terminating circuits coupled respectively to the coupled port and the direct port of the hybrid coupler, each reflective terminating circuit including two or more switchable reactive elements each having corresponding control lines; and
   mapping m control bits to n control lines for corresponding switchable reactive elements, where m≥n, to control such corresponding switchable reactive elements so as to provide a corrected phase shift mapping that achieves a desired thermometric coding for generating multiple equidistant phase shifts of a signal applied to the input port of the hybrid coupler.

Extended Range Phase Shift Mode

Thermometrically coded multi-reflective circuits 910 help in distributing reactances across phase bit states. The largest phase shift results from summation of all the essentially identical reactances associated with individual phase state bits. When used in the phase overlap mode described above, the phase shifter 900 shown in FIG. 9 is restricted to generating phase shifts only between the minimum and maximum phase shift values that can be generated by operating the same phase shifter 900 in a strict thermometric mode.

In some cases, it may be desirable to achieve an extended range of phase shifts that exceeds the maximum range of phase shifts available in a strict thermometric mode. One embodiment for accomplishing this is to adapt the phase shifter 900 so that the switchable reactive elements 912 of each multi-reflective terminating circuit 910 are not substantially identical, and are normally operated in a non-thermometric mode with progressively increasing reactance values for each switchable reactive element 912.

TABLE 11 shows one example of a mapping of phase state bits to control lines, using capacitors Cn with associated $C_{ON}$ values as the reactive elements Xn within the switchable reactive elements 912, to accomplish a uniform phase shift of 22.5° per phase state by turning on only one switchable reactive element 912 at a time.

TABLE 11

| PS Bits | b2 | b1 | b0 | $C_{ON}$ (pF) | $C_{OFF}$ (pF) | Phase Shift |
|---|---|---|---|---|---|---|
| 00 | 0 | 0 | 0 | 0.2 | NA | Reference |
| 01 | 0 | 0 | 1 | 0.3 | 0.2 | 22.5° |
| 10 | 0 | 1 | 0 | 0.47 | 0.2 | 45° |
| 11 | 1 | 0 | 0 | 0.73 | 0.2 | 67.5° |

Expressed in terms of a "REF" (for "reference") state and an "ON" state, the change in capacitance from reference state to ON state can be expressed as set forth in TABLE 12:

TABLE 12

$PS_{01\_REF} = C0_{OFF} + C1_{OFF} + C2_{OFF}$
$PS_{01\_ON} = C0_{ON} = C0$
$PS_{10\_REF} = C0_{OFF} + C1_{OFF} + C2_{OFF}$
$PS_{10\_ON} = C1_{ON} = C1$
$PS_{11\_REF} = C0_{OFF} + C1_{OFF} + C2_{OFF}$
$PS_{11\_ON} = C2_{ON} = C2$

With a phase shifter 900 circuit configuration that conforms to TABLE 11, an extended phase shift range can be achieved by operating that configuration as described above for the phase overlap mode, using a direct mapping of control bits to control lines. Accordingly, all of the individual control lines can be controlled in any combination, rather than only sequentially activated. TABLE 13 gives one example of an extended phase shift mode.

TABLE 13

| PS Bits | b2 | b1 | b0 | $C_{ON}$ (pF) | $C_{OFF}$ (pF) | Phase Shift |
|---|---|---|---|---|---|---|
| 000 | 0 | 0 | 0 | 0.21 | NA | Reference |
| 001 | 0 | 0 | 1 | 0.30 | 0.21 | 22.5° |
| 010 | 0 | 1 | 0 | 0.46 | 0.21 | 45° |
| 011 | 0 | 1 | 1 | 0.56 | 0.21 | 55° |
| 100 | 1 | 0 | 0 | 0.73 | 0.21 | 67.5° |
| 101 | 1 | 0 | 1 | 0.82 | 0.21 | 75° |
| 110 | 1 | 1 | 0 | 0.99 | 0.21 | 80° |
| 111 | 1 | 1 | 1 | 1.08 | 0.21 | 83.5° |

Figure 14:
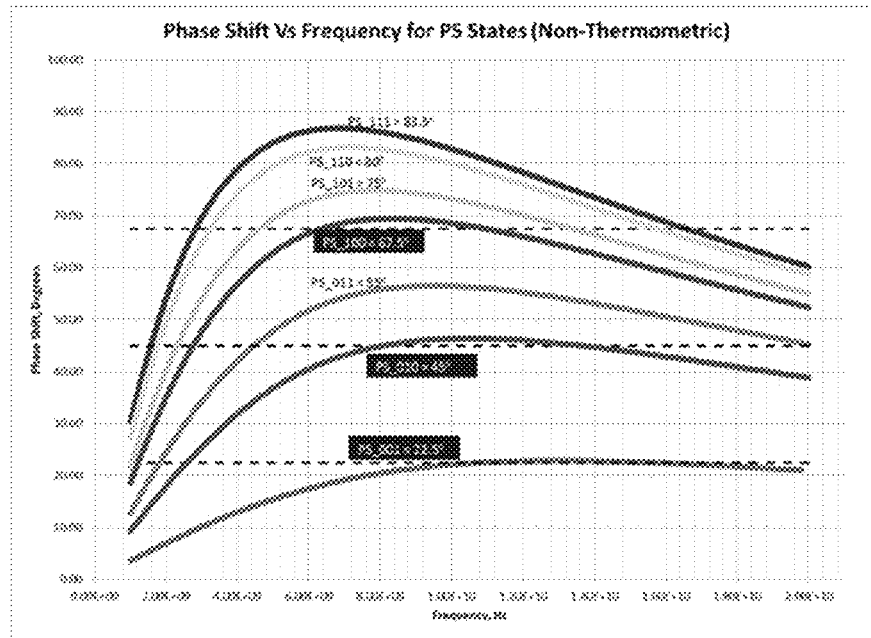
FIG. 14 is a graph showing the broadband phase shift versus frequency response for the specific circuit values shown in TABLE 13 for a programmable phase shifter operating in an extended range phase shift mode.

In this example, a subset of the phase shift bits (001, 010, 100) maps to a set of control bits bn that provides a uniform phase shift of 22.5° per phase state by activating only one capacitor-based switchable reactive element 912 at a time. In addition, an extended range of phase shifts (as well as some interstitial phase shifts) is available by activating more than one switchable reactive element 912 at a time. FIG. 14 is a graph 1400 showing the broadband phase shift versus frequency response for the specific circuit values shown in TABLE 13 for a programmable phase shifter operating in an extended range phase shift mode.

This aspect of the invention includes a method for programmably phase shifting an RF signal in multiple equidistant phase shifts, including:

providing a hybrid coupler having an input port, an output port, a coupled port, and a direct port;

providing first and second multi-reflective terminating circuits coupled respectively to the coupled port and the direct port of the hybrid coupler, each reflective terminating circuit including two or more switchable reactive elements, the two or more switchable reactive elements having progressively increasing reactance values; and selectively controlling selected ones of the two or more switchable reactive elements so as to generate multiple equidistant phase shifts of a signal applied to the input port of the hybrid coupler.

The above method may further include controlling the switchable reactive elements so as to generate an extended range of phase shifts of the signal applied to the input port of the hybrid coupler.

Tweak Bits

FIG. 9 showed three switchable reactive elements 912 per multi-reflective terminating circuit 910; as noted above, the number can be varied. However, there is an optional mode of operation where switchable reactive elements 912 are added to provide for correction and/or biasing (i.e., "tweaking") of the performance of a phase shifter by allowing small adjustments in circuit reactance under the control of "tweak bits" in order to achieve relatively small amounts of phase shift (e.g., less than about 10° total combined phase shift change, depending on frequency, but larger values may be of use in certain applications).

Figure 15:
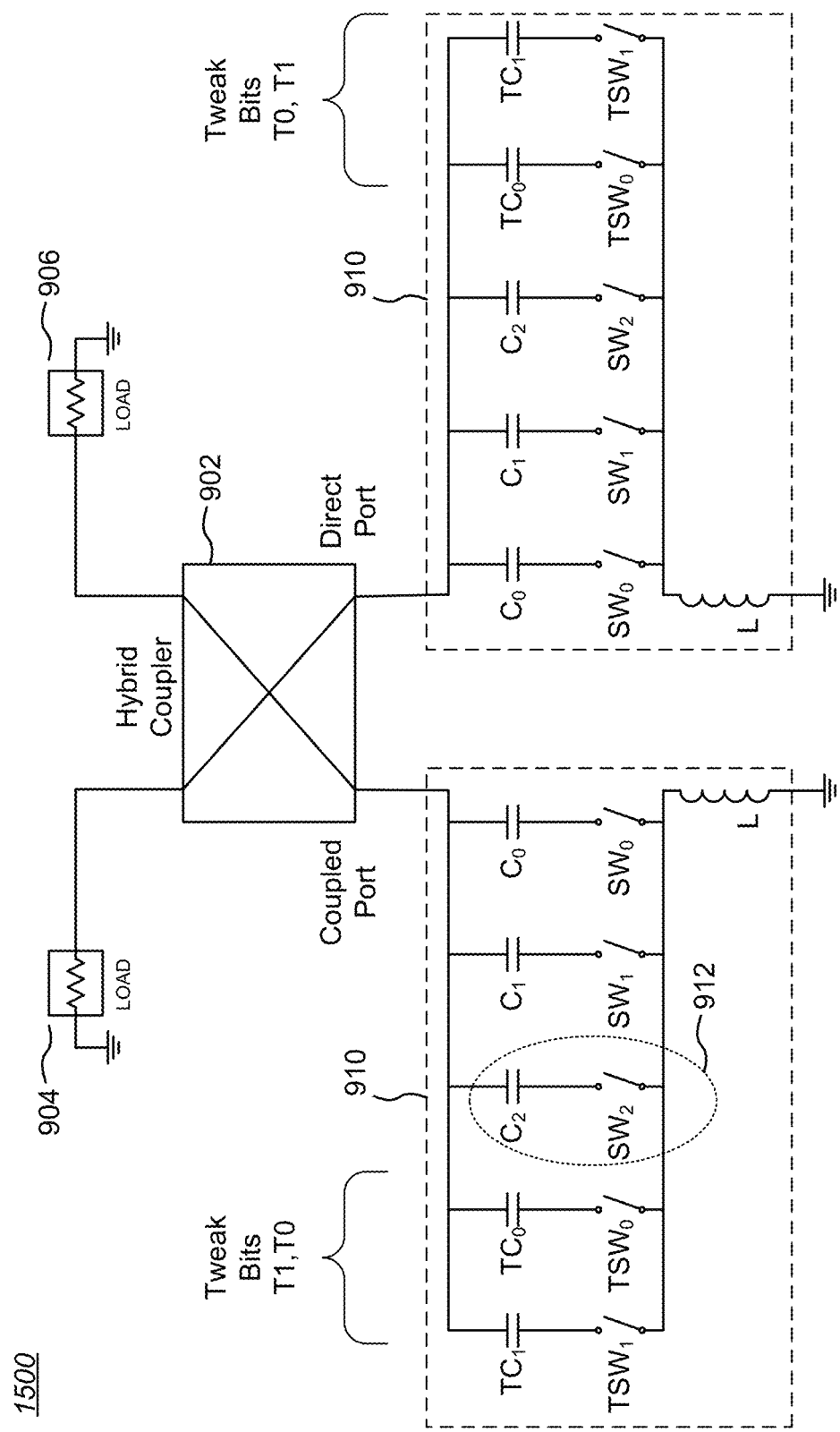
FIG. 15 is a schematic diagram of one embodiment of a programmable multi-reflective RF phase shifter having five capacitor/switch reactive elements per multi-reflective terminating circuit.

For example, FIG. 15 is a schematic diagram of one embodiment of a programmable multi-reflective RF phase shifter 1500 having five capacitor-based switchable reactive elements 912 $C_0$-$C_2$, $TC_0$, $TC_1$ per multi-reflective terminating circuit 910 (control lines, control bits, and mapping circuits have been omitted). In the illustrated embodiment, three of the capacitor-based switchable reactive elements 912 $C_0$-$C_2$, controlled by corresponding switches $SW_0$-$SW_2$, are main phase control units that provide a desired nominal level of incremental phase shifting under program control. However, in the illustrated embodiment, each multi-reflective terminating circuit 910 includes an additional T sets of selectable "tweaking" capacitor-based switchable reactive elements 912 controlled by "tweak bits" (two sets, $TC_0$, $TC_1$, are shown). More particularly, each added tweaking switchable reactive element 912 is controlled by a corresponding switch $TSW_T$, which may be dynamically selectably controlled by an internal or external mapping circuit 920 or an external control signal, or selectably set to a specific state after calibration by means of a fuse, metallization layer, read-only lookup table, or the like. The corresponding capacitance values $TC_T$ of each switchable reactive element 912 are generally relatively small, and may be, for example, sufficient to provide less than about 10° of phase shift (of course, taking into account the capacitance of the corresponding switch $TSW_T$ in an OFF state); however, larger values of phase shift may be of use in certain applications. Activating one or more tweak bit switches $TSW_T$ sets a corresponding phase shift reference state (i.e., the minimum reactance for a multi-reflective terminating circuit 910).

It should be noted that "tweaking" switchable reactive elements 912 may be used in conjunction with multi-reflective terminating circuits 910 of any type (e.g., thermometrically coded, binary coded, etc.).

Tweak bit capability enables the following benefits: (1) fine-tuning of the frequency band for optimum phase shift error (it being easier to make a relative shift than an absolute shift); (2) offsetting (re-tuning) performance shifts from nominal values due to confounding factors, including variations in the semiconductor fabrication process, IC supply voltage, and IC operating temperature (often abbreviated as "PVT", for "Process", "Voltage", and "Temperature" parameters); and/or (3) intentionally adding a mismatch between the multi-reflective terminating circuits 910 for the purpose of balancing overall performance of the phase shifter 1500. It is particularly useful to use such tweak bits as part of a calibration process, since the fine amounts of adjustment available can be used to tune a phase shifter 1500 (e.g., with fuses) without adding to the number of external control bits required for the switchable reactive elements 912 controlled by the $SW_n$ switches.

A useful aspect of tweak-bit correction is that the circuit concept can be used at the phase shifter block level (e.g., to fine tune a multi-reflective RF phase shifter 900), or at a higher system level where tweak-bit correction within a reflective RF phase shifter 900 may be used to compensate for or adjust phase or some other system metric of other connected circuitry. A benefit of tweak-bit correction can be overall phase-shifter performance and/or system level performance optimization (noting that having some phase shift insertion loss variation at the reflective RF phase shifter 900 level while maintaining consistent phase shift is often beneficial at the higher system level).

(1) Fine Tuning

Figure 16:
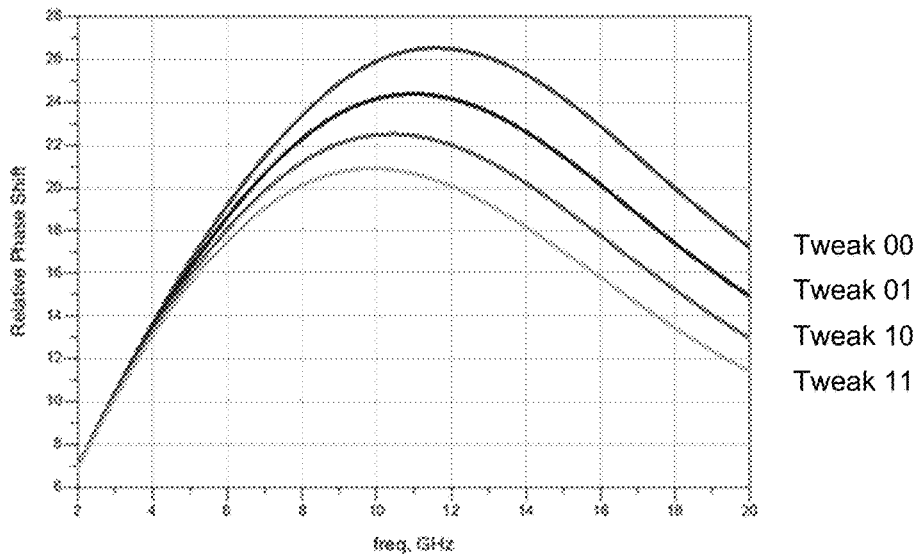
FIG. 16 is a graph showing the relative broadband phase shift versus frequency response for different tweak bit states while keeping the main phase shift state at 22.5°.

A digital phase shifter has an optimum performance in a narrow frequency band where the RMS phase error is minimum. FIG. 16 is a graph 1600 showing the relative broadband phase shift versus frequency response for different tweak bit states while keeping the main phase shift state at 22.5°. In the illustrated embodiment, two tweak bits are varied from binary "00" to binary "11". As can be seen, adding (or in some cases, subtracting—see below) slight amounts of reactance using the tweak bits can introduce a relatively small amount of performance variation.

(2) Process Variation Compensation

As noted, tweak bits can be used to re-center the performance characteristics of a phase shifter 1500 to compensate for PVT variations that cause circuit reactance that is either lower or higher than a desired reactance. For such purposes, it is generally preferred that one of the phase states (tweak bit states 00, 01, 10, or 11) that is in the center of the phase shift extremes that all such states can provide should be selected as the reference state. For example, if the range of tweak bit states from 00 to 11 can achieve 10° of phase shift, and tweak bit state 10 can provide 6° of phase shift, then tweak bit state 10 may be selected as the reference state. This allows for going both ways (increasing or decreasing overall reactance) in re-tuning the overall phase shift characteristics.

As another example, it may also be useful to design a phase shifter 1500 so that at least one tweak bit (each comprising a switchable reactive element 912) is nominally intended to be ON, so that in calibration one or more of such tweak bits can be turned OFF if necessary. This capability effectively allows adjustment by increasing or decreasing overall reactance, and allows for finer resolution.

(3) Intentional Mismatch

A hybrid coupler normally works on the principle that the reflection from both the coupled and direct ports is exactly the same, and accordingly identical reflection terminating units are used at both ports. Non-identical reflective terminating units will create a phase shift, but will generally cause some change/degradation in insertion and return loss compared to identical reactive elements, However, a hybrid coupler does not have symmetrical isolation from its input port to the coupled and direct ports. An additional aspect of the tweak bit concept is that an intentional reactance mismatch can be introduced between the coupled and direct ports to optimize performance for a particular frequency. The amount of mismatch may be fixed, a programmable difference based on another parameter (e.g., user setting, signal frequency, temperature, system or signal power, etc.), and/or a completely independently controllable/programmable externally from the multi-reflective RF phase shifter 900.

Figure 17:
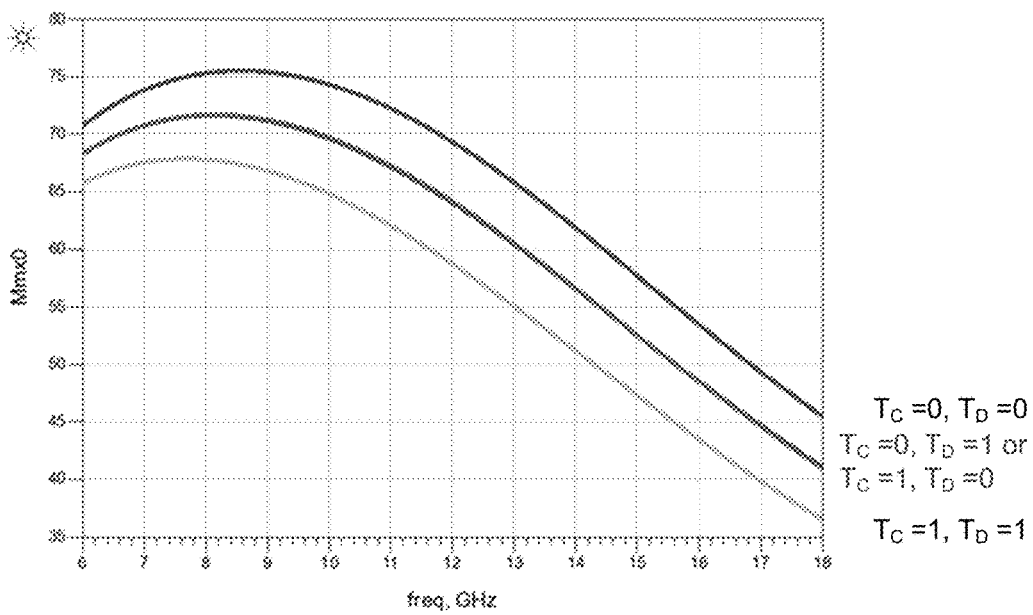
FIG. 17 is a graph showing phase shift versus frequency response for an embodiment of a programmable phase shifter configuration in which the state of identical tweak bits $T_C$, $T_D$ corresponding to each of the coupled and direct ports is controlled in an independent fashion while keeping the main phase shift state a 67.5°.

For example, referring to FIG. 15, one or more tweak bits (e.g., T sets of capacitor-based switchable reactive elements 912) can be provided for each of the coupled port and the direct port, such that the tweak bits for the two ports can be varied independently. FIG. 17 is a graph 1700 showing phase shift versus frequency response for an embodiment of a programmable phase shifter configuration in which the state of identical tweak bits $T_C$, $T_D$ (corresponding respectively to the coupled and direct ports) is controlled in an independent fashion while keeping the main phase shift state at 67.5° (note that the response for $T_C$=0, $T_D$=1 and $T_C$=1, $T_D$=0 is the same, subject to component variation).

Figure 18:
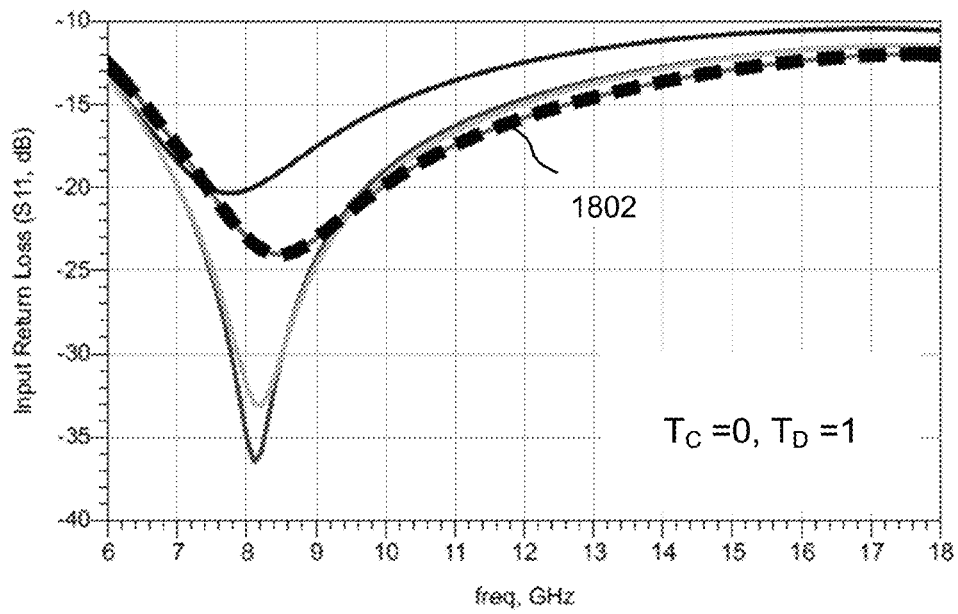
FIG. 18 is a graph that shows the return loss at the input port of the hybrid coupler for a particular tweak bit state for the coupled and direct ports while keeping the main phase shift state a 67.5°.
Figure 19:
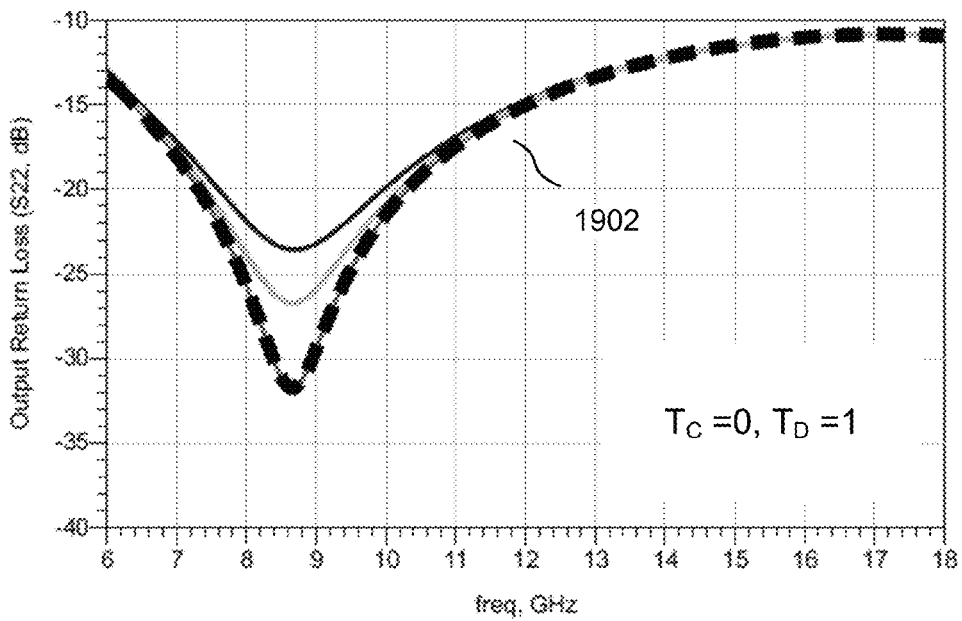
FIG. 19 is a graph that shows the return loss at the output port of the hybrid coupler for a particular tweak bit state for the coupled and direct ports while keeping the main phase shift state a 67.5°.

FIG. 18 is a graph 1800 that shows the return loss at the input port of the hybrid coupler for a particular tweak bit state ($T_C$=0, $T_D$=1) for the coupled and direct ports while keeping the main phase shift state a 67.5°. Similarly, FIG. 19 is a graph 1900 that shows the return loss at the output port of the hybrid coupler for a particular tweak bit state ($T_C$=0, $T_D$=1) for the coupled and direct ports while keeping the main phase shift state a 67.5°. Referring to the heavy dashed lines 1802, 1902, the state that loads the coupled port slightly more than the direct port gives slightly better return loss performance. The reason for this is that the isolation from the input port to the direct port is better than the isolation from the input port to the coupled port, and hence more power needs to be reflected off of the coupled port to balance out and reroute the power to the isolated port. Tweak bits allow imposing an intentional reactance imbalance on the coupled and direct ports to achieve better isolation. The other curves illustrate similar comparisons with different combinations of $T_C$ and $T_D$.

This aspect of the invention includes a method for programmably phase shifting an RF signal in multiple phase shifts, including:

providing a hybrid coupler having an input port, an output port, a coupled port, and a direct port;

providing first and second multi-reflective terminating circuits coupled respectively to the coupled port and the direct port of the hybrid coupler, each reflective terminating circuit including:

two or more main phase control switchable reactive elements; and at least one selectable tweaking reactive element having a total reactance sufficient to shift the phase of a signal applied to the input port of the hybrid coupler by less than about 10°;

controlling the main phase control switchable reactive elements so as to generate multiple phase shifts of the signal applied to the input port of the hybrid coupler; and selecting at least one selectable tweaking switchable reactive element for shifting the phase of the signal by a set amount to fine tune or compensate for confounding factors to the overall phase shift applied to the signal.

The above method may further include setting the amount of phase shift of the signal by the at least one selectable tweaking switchable reactive element in the first multi-reflective terminating circuit to be different from the amount of phase shift of the signal by the at least one selectable tweaking switchable reactive element in the second multi-reflective terminating circuit.

Combinations of Phase Shifters

Figure 20:
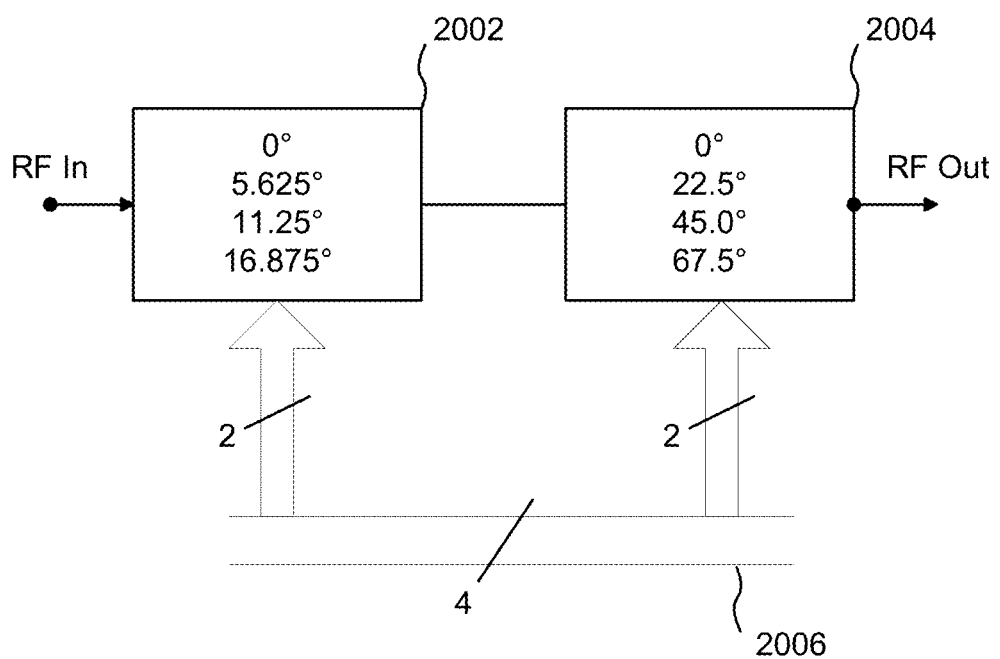
FIG. 20 is a block diagram showing two programmable multi-reflective RF phase shifters coupled in series.

A number of programmable multi-reflective RF phase shifters of the types described above, with different phase shift increments, can be series or parallel connected to provide a desired gamut of phase shift. In particular, it is often useful to series-connect two or more such phase shifters having different phase shift increments, in order to achieve fine control of the amount of phase shift in a system. For example, FIG. 20 is a block diagram showing two programmable multi-reflective RF phase shifters 2002, 2004 coupled in series. One multi-reflective RF phase shifter 2002 has incremental phase shift states of 0°, 5.625°, 11.25°, and 16.875°, while the other multi-reflective RF phase shifter 2004 has incremental phase shift states of 0°, 22.5°, 45°, and 67.5°. In the illustrated embodiment, a 4-bit control bus 2006 provides two control bits to each of the multi-reflective RF phase shifters 2002, 2004. In the simplest 2-bit per phase shifter thermometric configuration described above, the illustrated series multi-reflective RF phase shifters could provide phase shifts from about 0° to about 84.375° in increments of 5.625°; of course, additional multi-reflective RF phase shifter stages (e.g., 90° and 180°) may be serially added to increase the range of available phase shift states.

In addition, programmable multi-reflective RF phase shifters of the types described above can be combined with other types of phase shifters and/or non-multi reflective phase shifters. For example, it may be useful to combine one or more programmable multi-reflective RF phase shifters with one or more selectable non-reflective or reflective phase shifters capable of only providing a fixed phase shift when selected (e.g., 90° or 180°) to increase the available phase shift gamut. One example series configuration includes a first programmable multi-reflective RF phase shifter having incremental phase shift states of 5.625°, 11.25°, and 16.875°, a second programmable multi-reflective RF phase shifter having incremental phase shift states of 22.5°, 45°, and 67.5°, a first selectable phase shifter having a fixed phase shift of 90°, and a second selectable phase shifter having a fixed phase shift of 180°. In the simplest 2-bit per phase shifter thermometric configuration described above, this set of phase shifters could provide phase shifts from about 0° to about 354.375° in increments of 5.625°.

Calibration

The following describes several methods that may be taken to calibrate a programmable multi-reflective RF phase shifter of any of the types described above. In calibrating a circuit of this type, the chief tasks are either to simply characterize the actual phase shift for each phase state value so that a known output matches up to a known input, or, more usefully, to map each phase state value to a combination of switchable reactive elements 912 that best achieve the specified amount of phase shift, thereby achieving a corrected output for each input. The latter task is more easily achieved using overprovisioning and/or tweak bits as described above.

For example, in a 3-bit multi-reflective RF phase shifter (normally both multi-reflective terminating circuits 910 are controlled together, although tweak bits may be intentionally selected separately), each of the binary values from 0-7 that may be applied to each side of the phase shifter to select an amount of phase shift may be mapped to a specific combination of switchable reactive element 912. In do so, it must be remembered that for a large frequency band (e.g., 2 GHz or greater), phase shifts have a frequency dependency. Due to the frequency dependent nature of the switchable reactive elements 912, the hybrid coupler 902, and parasitic ground inductance L, a phase shifter circuit generally cannot actually provide the exact amount of designed phase shift for a very large frequency band (hence the need for calibration). So a particular nominal phase state setting may not achieve the desired phase shift for a broadband operation, but there may exist another phase state setting that more closely achieves the desired phase shift. As an example, it may be that phase state "3" (which may map to control line $b_n$ values of "011") should cause the phase shift of a particular multi-reflective RF phase shifter to be 45°, which might normally be achieved by activating a single pair of switchable reactive elements 912 (i.e., one switchable reactive element 912 in each reflective terminating circuit 202, 203). However, the measured phase shift may be only 40°. Accordingly, it may be necessary to map phase state "3" to a set of control line values that not only activate the designed pair of switchable reactive elements 912, but also activate a second pair of switchable reactive elements 912 that substantially provide the needed additional phase shift of 5°. For example, TABLE 9 and TABLE 10 above show a calibration mapping of phase state "3" to control line $b_n$ values of "100" rather than to the nominally expected control line $b_n$ values of "011".

Figure 21:
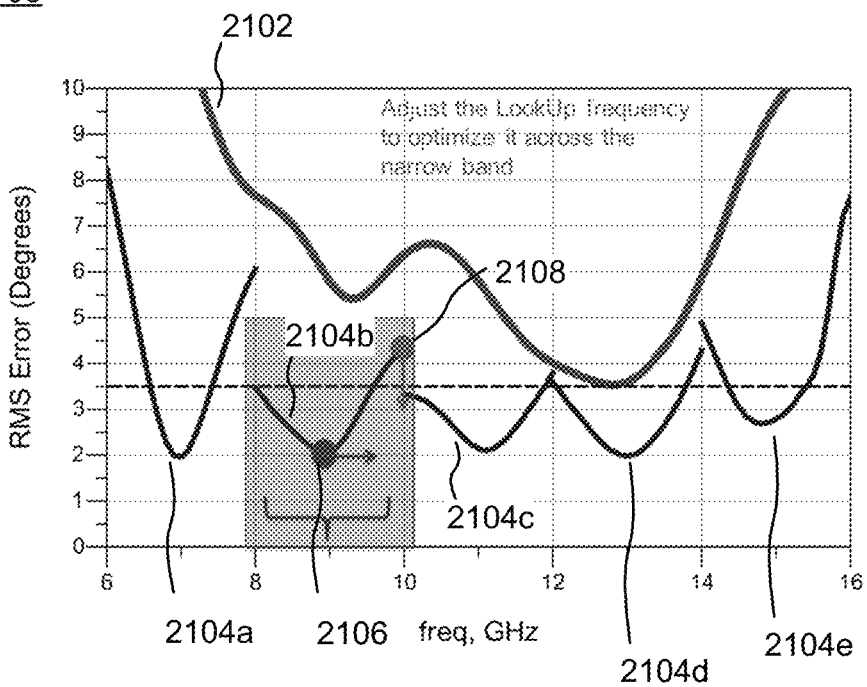
FIG. 21 is a graph illustrating one calibration method for a programmable multi-reflective RF phase shifter when it is known that the input frequency of interest will fall in a precise frequency range.

FIG. 21 is a graph 2100 illustrating one calibration method for a programmable multi-reflective RF phase shifter when it is known that the input frequency of interest will fall in a precise frequency range (e.g., only a relatively wide frequency band of operation is known, such as that a received signal will be in a 2 GHz band between 8 and 10 GHz). Graph line 2102 represents the uncorrected "raw" root-mean-square (RMS) phase error for all phase shift state settings (e.g., 0-63 for a 6-bit multi-reflective RF phase shifter, covering a phase shift range of 0.0° to 354.375° in 5.625° steps) of the phase shifter when an input test signal is applied over a frequency band of interest (here, 6 GHz-16 GHz), where lower RMS phase error is better.

Since precise signal frequency information is not available for the input frequency of interest, in the illustrated embodiment, the entire operational frequency band is subdivided into somewhat broad sub-bands (here, 2 GHz per sub-band). The RMS phase error at all of the phase states is measured across each sub-band and a determination is made as to what mapping of phase state bits to active capacitor/switch reactive elements 912 give the lowest RMS phase error within such sub-band. In addition, a variable attenuator in series with the programmable multi-reflective RF phase shifter may also be varied to achieve lower RMS phase errors in each sub-band. In the illustrated embodiment, mapping some set of nominal phase states and attenuation states within each sub-band to actual circuit states reduces the RMS phase error to values that correspond to the graph lines 2104a-2104e. For example, for the 8 to 10 GHz sub-band, point 2106 indicates the lowest RMS phase error.

In one embodiment, for each sub-band, the mapped phase states that provide the best improvement in RMS phase error is stored in a mapping circuit (see, e.g., mapping circuit 920 in FIG. 9). During use, when the center frequency of a signal applied to the calibrated multi-reflective RF phase shifter falls anywhere within a sub-band (e.g., if the frequency is 8.5 GHz), the stored phase state mapping for the bounding sub-band (e.g., from 8 to 10 GHz) is retrieved from the mapping circuit and applied to set the actual circuit states of the capacitor/switch reactive elements 912 of the phase shifter, thereby reducing the RMS phase error of the phase shifted applied signal within that sub-band in comparison to the uncorrected RMS phase error.

As should be clear, the above method may be used with wider sub-bands; in the extreme case, a single sub-band (and hence a single lookup table) may be used.

In an alternative embodiment, for one or more sub-bands, a mapping of phase states that provides some improvement (but not necessarily the best improvement) in RMS phase error but with less variation in insertion loss (IL) may be stored in the mapping circuit rather than the phase state mapping that provides the best improvement in RMS phase error alone. Further, if two mappings of phase states provide about the same amount of improvement in RMS phase error, then the phase state mapping that least varies the IL normally should be the mapping that is selected and stored.

There may be "edge" cases where the best mapping of phase states for a particular center frequency is in an adjacent sub-band. For example, in FIG. 21, for a signal center frequency at 10 GHz (see frequency point 2108), graph curve 2104c provides a lower RMS phase error than graph curve 2104b. Accordingly, the lookup values for the mapping circuit may be optimized by slightly shifting the "boundaries" of the frequency values corresponding to the edges of the sub-bands to maximize broadband operation within each sub-band. Thus, for example, if a received signal has a center frequency at 10 GHz, the lookup table for the 10-12 GHz sub-band may be preferentially applied rather than the lookup table for the 8-10 GHz sub-band.

Figure 22:
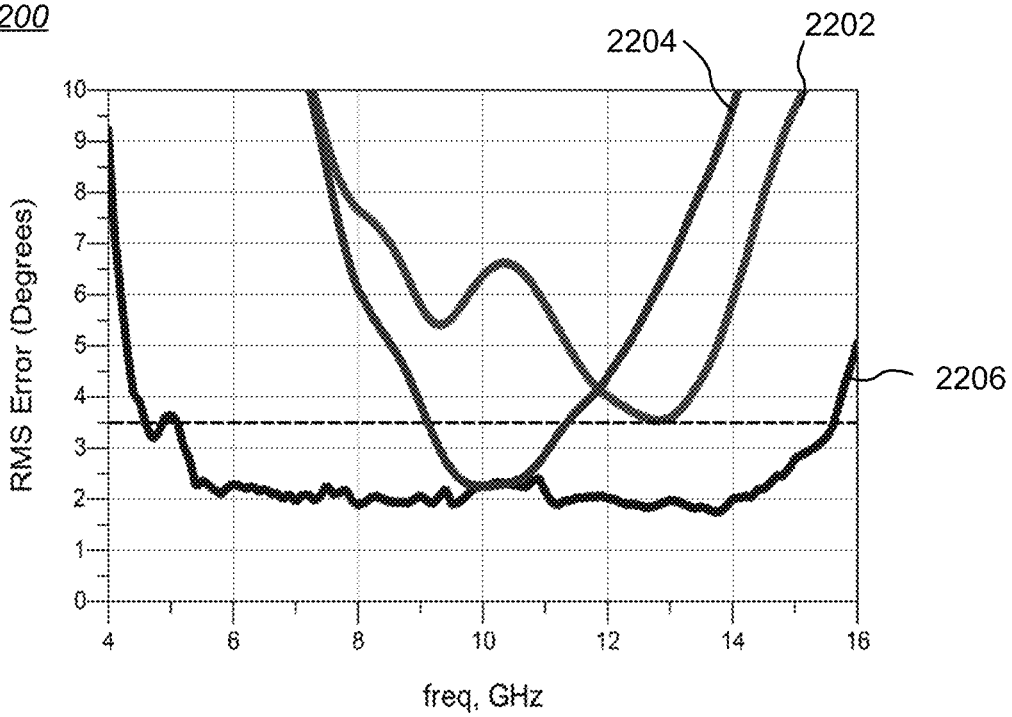
FIG. 22 is a graph illustrating another calibration method for a programmable multi-reflective RF phase shifter that is particular useful for cases where prior information is available regarding the precise single frequency of an expected input signal.

FIG. 22 is a graph 2200 illustrating another calibration method for a programmable multi-reflective RF phase shifter that is particular useful for cases where prior information is available regarding the precise single frequency of an expected input signal. Graph line 2202 represents the uncorrected RMS phase error of an applied input test signal over a frequency band of interest (here, 6 GHz-16 GHz) for such a phase shifter. Graph line 2204 is an example of the correction that might be applied to a signal having a center frequency of 10 GHz if the method shown in FIG. 21 is applied for only a single sub-band. As can be seen, a single set of correction values works reasonably well for a limited range of frequencies (e.g., 2 GHz wide) around the center frequency of the signal. However, the RMS phase error increases outside that sub-band increases significantly.

Accordingly, if lookup table space is available, it is useful to increase the number of sub-bands—and thus decreasing their frequency span—to achieve a finer degree of correction where prior information is available regarding the precise center frequency of an expected input signal. For example, graph line 2206 reflects usage of 100 MHz sub-bands with the same procedure as was used with FIG. 21. As should be clear, for any signal center frequency within the calibrated band, the corrected graph line 2206 represents a lower RMS phase error compared to the uncorrected Graph line 2202. An IC embodiment that includes such fine-grained lookup tables is especially useful in applications (e.g., cellular radios) where the bandwidth of a signal is constrained (e.g., 2 GHz) but the center frequency may vary over a fairly large range.

The calibration methods of FIG. 21 and FIG. 22 may require storing a large number of lookup values. It may be useful to apply a polynomial technique that allows mapping of discrete phase control bits to an analog model of the phase shift response of a multi-reflective RF phase shifter to reduce such storage requirements. In one embodiment, a multi-reflective RF phase shifter comprising multiple major phase shifter blocks (e.g., 180°, 90°, and 45°) is calibrated, as in FIG. 21, at a selected base center frequency (e.g., 8 GHz), and the corrected bit values are stored in a lookup table. Then each major phase shifter block is characterized over the frequency range to find out their respective deviation from their setting at the selected base center frequency. For example, the best setting for a 45° phase shifter block may be slightly different at 7.2 GHz than at 8 GHz. With this information, a polynomial can be fitted to the data measured for the major phase shifting blocks, and corresponding digital values stored in multiple smaller lookup tables (or separate sections of one mapping circuit 920) corresponding to specific center frequencies of an applied signal.

In use, depending on the actual frequency of an applied signal, the stored center frequency lookup table values are used to set the phase state of each major phase shifter block, but then a frequency-specific correction is applied based on mapping the actual center frequency of the applied signal to a corresponding polynomial lookup table.

Figure 23A:
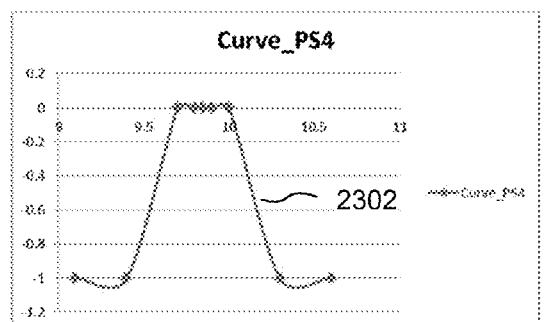
FIG. 23A is a graph of a curve showing a mapping of correction "deltas" as a function of frequency (in GHz) for a selected base center frequency.

FIG. 23A is a graph of a curve 2302 showing a mapping of correction "deltas" as a function of frequency (in GHz) for a selected base center frequency (in this case, about 9.8 GHz). Each rhombic data point represents how much correction (in terms of control bit values) should be applied to a major phase shifter block as frequency deviates from the selected base center frequency. Thus, from about 9.7 to about 19 GHz, zero correction is applied, and below about 9.5 GHz and above about 10.3 GHz, a correction of −1 should be applied. It should be noted that the curve 2302 does not represent measured data points per se, but instead represents a continuous extrapolation between measured data points.

FIG. 23B is a graph of a curve 2304 showing a mapping of correction "deltas" as a function of frequency (in GHz) for a selected base center frequency for the left side of the curve 2302 shown in FIG. 23A. FIG. 23C is a graph of a curve 2306 showing a mapping of correction "deltas" as a function of frequency (in GHz) for a selected base center frequency for the right side of the curve 2302 shown in FIG. 23A. The split of curve 2302 into left and right sides facilitates fitting of a polynomial curve to the data points. In both cases, a polynomial function is fitted, in known fashion, to the rhombic data points such that each center frequency within the range of the curves 2304, 2306 can be input to the function and the nearest discrete correction value can be determined. For example, if the actual center frequency of an applied signal is 9.5 GHz (indicated by the "0" symbol 2308), the nearest correction bit is data point 2310 (i.e., −1 correction). Accordingly, curves 2304 and 2306 show that a large range of frequencies can by mapped to a few correction values. Thus, this approach trades off computation time for storage space (e.g., one complete lookup table for every 100 MHz).

Figure 24:
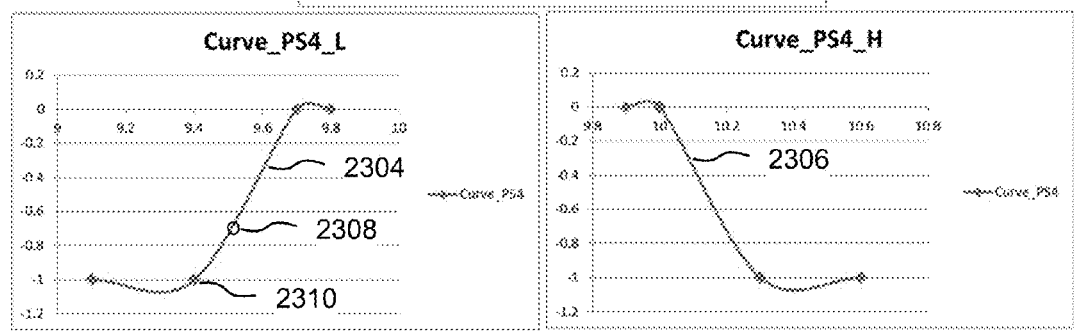
FIG. 24 is a graph illustrating another calibration method for a broadband programmable multi-reflective RF phase shifter over a narrower frequency band.
Figure 24:
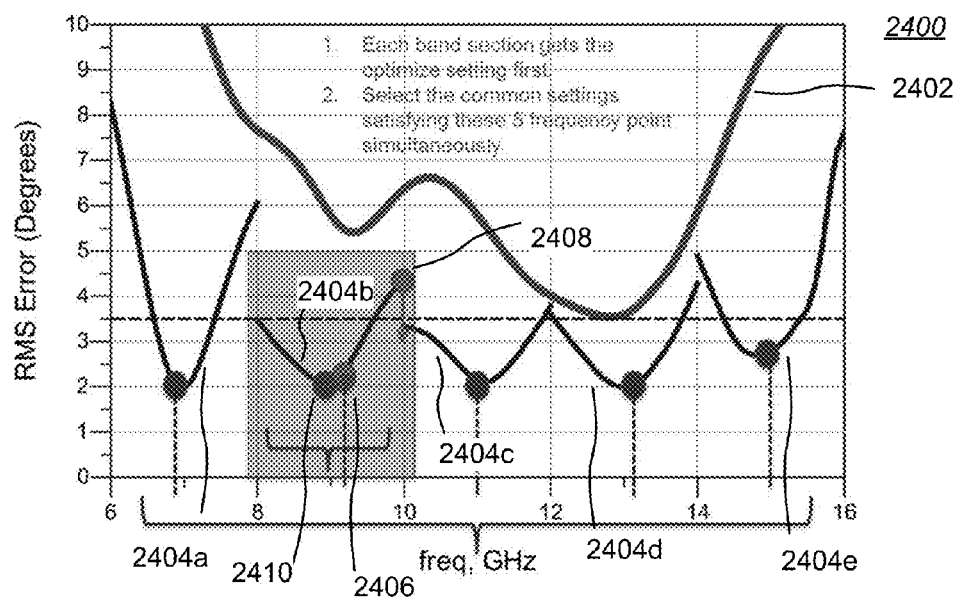

FIG. 24 is a graph 2400 illustrating another calibration method for a broadband programmable multi-reflective RF phase shifter over a narrower frequency band. Graph line 2402 represents the uncorrected RMS phase error of an applied input test signal over a frequency band of interest (here, 6 GHz-16 GHz) for such a phase shifter. This method is similar to the method described above for FIG. 21, in that the frequency band is subdivided into sub-bands (here, 2 GHz per sub-band, but wider or narrower sub-bands may be used). The RMS phase error at all of the phase states is measured across each sub-band and a determination is made as to what mapping of phase state bits to active capacitor/switch reactive elements 912 give the lowest RMS phase error within such sub-band. In the illustrated embodiment, applying some set of phase adjustment states within each sub-band reduces the RMS phase error to values that correspond to the graph lines 2404a-2404e (again, lower RMS phase error is better, as indicated by the dots at the bottom of each graph line 2404a-2404e).

Once the initial set of phase adjustment states is determined for the set of sub-bands, then the "common denominator" of those sub-bands is determined. For example, if control line b1 is ON in most or all of the sub-bands, then it is common to the majority of sub-bands. Accordingly, control line b1 can be permanently set to "ON" for the entire range of frequencies in the band of interest. Determining such common denominators for multiple frequencies allows creation of a single lookup table that is a compromise but approximates an optimum for the whole band.

The additional indicator dots 2406, 2408 in FIG. 24 show another example of a concept described above. A sub-band look-up frequency may be offset slightly within the sub-band to shift an edge to another sub-band in order to improve the RMS phase error. In this example, the center frequency at dot 2410 is shifted towards the right to the position of dot 2406. Doing so brings down (as indicated by the arrow) the high edge at dot 2408, thus improving the RMS phase error at the boundary.

Fabrication

The hybrid coupler may be an external component coupled to multi-reflective terminating circuits, or the entire phase shifter may be fabricated as a monolithic or hybrid circuit.

There are numerous advantages to embodying the multi-reflective terminating circuit concepts described above in complementary metal-oxide-semiconductor (CMOS) ICs using stacked CMOS FET switches fabricated with a silicon-on-insulator (SOI) process (which includes silicon-on-sapphire, or SOS). In particular, stacked FET switches provide an improvement in the linearity and power handling capability of the circuit by allowing each switch to operate in a less stressed, and therefore more linear, region. Fabrication in CMOS on SOI or SOS also provides low power, good linearity, and high frequency operation (in excess of 10 GHz).

Monolithic integrated circuit implementation of at least the multi-reflective terminating circuits is particularly useful since parasitic capacitances and inductances generally can be kept low by careful design. However, while the embodiments described above have utilized FET switches, the inventive concepts extend to other switches that exhibit some capacitance in an "OFF" state, such as RF microelectromechanical system (MEMS) switches.

Further, as should be readily apparent to one of ordinary skill in the art, various embodiments of the invention can be implemented to meet a wide variety of specifications. Thus, selection of suitable component values is a matter of design choice. Various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, and MESFET processes. Voltage levels may be adjusted or voltage polarities reversed depending on a particular specification and/or implementing technology (e.g., NMOS, PMOS, or CMOS). Component voltage, current, and power handling capabilities may be adapted as needed, for example, by adjusting device sizes, serially "stacking" components to handle greater voltages, and/or using multiple components in parallel to handle greater currents.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A programmable multi-reflective radio frequency (RF) phase shifter, including:
   (a) a hybrid coupler having an input port, an output port, a coupled port, and a direct port;
   (b) first and second multi-reflective terminating circuits coupled respectively to the coupled port and the direct port of the hybrid coupler, each multi-reflective terminating circuit including two or more switchable reactive elements; and
   (c) thermometric coding control circuitry coupled to the first and second multi-reflective terminating circuits for sequentially controlling the switchable reactive elements so as to generate multiple equidistant phase shifts of a signal applied to the input port of the hybrid coupler.

2. The programmable multi-reflective RF phase shifter of claim 1, wherein the thermometric coding control circuitry further controls the switchable reactive elements so as to generate at least one interstitial phase shift of the signal applied to the input port of the hybrid coupler.

3. The programmable multi-reflective RF phase shifter of claim 1, wherein the switchable reactive elements have corresponding control lines, and the thermometric coding control circuitry maps m control bits to n of the control lines, where m≥n, to provide a corrected phase shift mapping that achieves a desired thermometric coding so as to generate the multiple equidistant phase shifts of the signal applied to the input port of the hybrid coupler.

4. The programmable multi-reflective RF phase shifter of claim 1, wherein the switchable reactive elements are capacitor/switch reactive elements.

5. The programmable multi-reflective RF phase shifter of claim 1, wherein the reactive elements are fabricated as monolithic integrated circuits using a silicon-on-insulator (SOI) process.

6. The programmable multi-reflective RF phase shifter of claim 1, wherein the reactive elements include stacked field effect transistor switches.

7. The programmable multi-reflective RF phase shifter of claim 6, wherein the field effect transistor switches are implemented in complementary metal-oxide-semiconductor (CMOS) circuitry.

8. A programmable multi-reflective radio frequency (RF) phase shifter, including:
   (a) a hybrid coupler having an input port, an output port, a coupled port, and a direct port;
   (b) first and second multi-reflective terminating circuits coupled respectively to the coupled port and the direct port of the hybrid coupler, each multi-reflective terminating circuit including two or more switchable reactive elements, the two or more switchable reactive elements having progressively increasing reactance values; and
   (c) control circuitry coupled to the first and second multi-reflective terminating circuits for selectively controlling selected ones of the two or more switchable reactive elements so as to generate multiple equidistant phase shifts of a signal applied to the input port of the hybrid coupler.

9. The programmable multi-reflective RF phase shifter of claim 8, wherein the control circuitry further controls the switchable reactive elements so as to generate an extended range of phase shifts of the signal applied to the input port of the hybrid coupler.

10. The programmable multi-reflective RF phase shifter of claim 8, wherein the switchable reactive elements are capacitor/switch reactive elements.

11. The programmable multi-reflective RF phase shifter of claim 8, wherein the reactive elements are fabricated as monolithic integrated circuits using a silicon-on-insulator (SOI) process.

12. The programmable multi-reflective RF phase shifter of claim 8, wherein the reactive elements include stacked field effect transistor switches.

13. The programmable multi-reflective RF phase shifter of claim 12, wherein the field effect transistor switches are implemented in complementary metal-oxide-semiconductor (CMOS) circuitry.

14. A programmable multi-reflective radio frequency (RF) phase shifter, including:
   (a) a hybrid coupler having an input port, an output port, a coupled port, and a direct port;
   (b) first and second multi-reflective terminating circuits coupled respectively to the coupled port and the direct port of the hybrid coupler, each multi-reflective terminating circuit including:
      (1) two or more main phase control switchable reactive elements; and
      (2) at least one selectable tweaking reactive element each having a reactance sufficient to shift the phase of a signal applied to the input port of the hybrid coupler by an associated degree;
   (c) control circuitry coupled to the first and second multi-reflective terminating circuits for controlling the main phase control switchable reactive elements so as to generate multiple phase shifts of the signal applied to the input port of the hybrid coupler; and
   (d) selection circuitry coupled to the at least one selectable tweaking switchable reactive element for shifting the phase of the signal by the associated degree to fine tune or compensate for confounding factors to the overall phase shift applied to the signal.

15. The programmable multi-reflective RF phase shifter of claim 14, wherein the set amount of phase shift of the signal by the at least one selectable tweaking switchable reactive element in the first multi-reflective terminating circuit is different from the set amount of phase shift of the signal by the at least one selectable tweaking switchable reactive element in the second multi-reflective terminating circuit.

16. A circuit configuration in which at least one of the programmable multi-reflective RF phase shifters in accordance with claim 1, 8, or 14 is coupled in series to an RF phase shifter having a different range of phase shifting.

17. A circuit configuration in which at least two of the programmable multi-reflective RF phase shifters in accordance with claim 1, 8, or 14 are coupled in series, and each RF phase shifter provides a different range of phase shifting.

18. A method for programmably phase shifting an RF signal in multiple equidistant phase shifts, including:
   (a) providing a hybrid coupler having an input port, an output port, a coupled port, and a direct port;
   (b) providing first and second multi-reflective terminating circuits coupled respectively to the coupled port and the direct port of the hybrid coupler, each multi-reflective terminating circuit including two or more switchable reactive elements; and
   (c) sequentially controlling the switchable reactive elements by means of thermometric coding so as to generate multiple equidistant phase shifts of a signal applied to the input port of the hybrid coupler.

19. A method for programmably phase shifting an RF signal in multiple equidistant phase shifts, including:
   (a) providing a hybrid coupler having an input port, an output port, a coupled port, and a direct port;
   (b) providing first and second multi-reflective terminating circuits coupled respectively to the coupled port and the direct port of the hybrid coupler, each multi-reflective terminating circuit including two or more switchable reactive elements;
   (c) sequentially controlling the switchable reactive elements by means of thermometric coding so as to generate multiple equidistant phase shifts of a signal applied to the input port of the hybrid coupler; and
   (d) controlling the switchable reactive elements so as to generate at least one interstitial phase shift of the signal applied to the input port of the hybrid coupler.

20. A method for programmably phase shifting an RF signal in multiple equidistant phase shifts, including:
   (a) providing a hybrid coupler having an input port, an output port, a coupled port, and a direct port;
   (b) providing first and second multi-reflective terminating circuits coupled respectively to the coupled port and the direct port of the hybrid coupler, each multi-reflective terminating circuit including two or more switchable reactive elements each having corresponding control lines; and
   (c) mapping m control bits to n of the control lines for corresponding switchable reactive elements, where m≥n, to control such corresponding switchable reactive elements so as to provide a corrected phase shift mapping that achieves a desired thermometric coding for generating multiple equidistant phase shifts of a signal applied to the input port of the hybrid coupler.

21. A method for programmably phase shifting an RF signal in multiple equidistant phase shifts, including:
   (a) providing a hybrid coupler having an input port, an output port, a coupled port, and a direct port;

(b) providing first and second multi-reflective terminating circuits coupled respectively to the coupled port and the direct port of the hybrid coupler, each multi-reflective terminating circuit including two or more switchable reactive elements, the two or more switchable reactive elements having progressively increasing reactance values; and (c) selectively controlling selected ones of the two or more switchable reactive elements so as to generate multiple equidistant phase shifts of a signal applied to the input port of the hybrid coupler.

22. The method of 21, further including controlling the switchable reactive elements so as to generate an extended range of phase shifts of the signal applied to the input port of the hybrid coupler.

23. A method for programmably phase shifting an RF signal in multiple phase shifts, including:

(a) providing a hybrid coupler having an input port, an output port, a coupled port, and a direct port;

(b) providing first and second multi-reflective terminating circuits coupled respectively to the coupled port and the direct port of the hybrid coupler, each multi-reflective terminating circuit including:

(1) two or more main phase control switchable reactive elements; and (2) at least one selectable tweaking reactive element each having a reactance sufficient to shift the phase of a signal applied to the input port of the hybrid coupler by an associated degree;

(c) controlling the main phase control switchable reactive elements so as to generate multiple phase shifts of the signal applied to the input port of the hybrid coupler; and (d) selecting at least one selectable tweaking switchable reactive element for shifting the phase of the signal by the associated degree to fine tune or compensate for confounding factors to the overall phase shift applied to the signal.

24. The method of claim 23 further including setting the amount of phase shift of the signal by the at least one selectable tweaking switchable reactive element in the first multi-reflective terminating circuit to be different from the amount of phase shift of the signal by the at least one selectable tweaking switchable reactive element in the second multi-reflective terminating circuit.

25. A method of calibrating a programmable multi-reflective radio frequency (RF) phase shifter of the type of claim 1, 8, or 14, including the steps of:

(a) subdividing an entire operational frequency band into a plurality of sub-bands;

(b) measuring a root-mean-square (RMS) phase error at all of the phase states of the phase shifter across each sub-band of the plurality of sub-bands; and (c) generating a mapping of phase state bits to the switchable reactive elements that provides a low RMS phase error for the phase shifter within each sub-band of the plurality of sub-bands.

26. The method of claim 25, wherein each sub-band is about 2 GHz wide.

27. The method of claim 25, wherein each sub-band is about 100 MHz wide.

28. The method of claim 25, further including varying a level of attenuation coupled in series with the programmable multi-reflective RF phase shifter while measuring the RMS phase error.

29. The method of claim 25, further including applying the mapping during use of the phase shifter to select and apply phase state bits to the phase shifter associated with a sub-band, out of the plurality of sub-bands, corresponding to a center frequency of an RF input signal applied to the phase shifter.

30. The method of claim 25, wherein generating the mapping of phase state bits to the switchable reactive elements provides the lowest RMS phase error for the phase shifter within each sub-band of the plurality of sub-bands.

31. The method of claim 25, further including measuring insertion loss for each phase state of the phase shifter, and wherein generating the mapping of phase state bits to the switchable reactive elements includes preferring phase state bit values having less variation in insertion loss than other phase state bit values while still exhibiting low RMS phase error.

32. The method of claim 25, further including optimizing the mapping by selectively shifting edge frequencies of a sub-band to an adjacent sub-band to maximize broadband operation for RF input signals applied to the phase shifter that have a center frequency within such edge frequencies.

33. The method of claim 25, further including fitting a polynomial to the measured RMS phase error and storing digital values in one or more mapping circuits that correspond to specific center frequencies of an applied signal.

34. The method of claim 25, further including determining a common denominator of phase state bits for the sub-bands.

35. The invention of claims 1, 8, 14, 18, 19, 20, 21, or 23, wherein at least one switchable reactive element including at least one reactance component series-coupled to a corresponding field effect transistor switch circuit for selectively coupling the corresponding at least one reactance component to a respective one of the coupled port or direct port of the hybrid coupler, wherein each at least one switchable reactive element has a conductive state reactance and a non-conductive state reactance, and wherein the value of the conductive state reactance is selected to achieve a desired level of phase shift for the switchable reactive element for a selected ratio of the conductive state reactance to the non-conductive state reactance.

\* \* \* \* \*